(12) United States Patent
Pforr

(10) Patent No.: US 8,539,394 B2
(45) Date of Patent: Sep. 17, 2013

(54) METHOD AND APPARATUS FOR MINIMIZING OVERLAY ERRORS IN LITHOGRAPHY

(75) Inventor: Rainer Pforr, Dresden (DE)

(73) Assignee: Carl Zeiss SMS Ltd., Karmiel (IL)

( * ) Notice: Subject to any disclaimer, the term of this patent is extended or adjusted under 35 U.S.C. 154(b) by 0 days.

(21) Appl. No.: 13/408,695

(22) Filed: Feb. 29, 2012

(65) Prior Publication Data

US 2012/0227014 A1 Sep. 6, 2012

Related U.S. Application Data

(60) Provisional application No. 61/448,253, filed on Mar. 2, 2011.

(51) Int. Cl.
*G06F 17/50* (2006.01)

(52) U.S. Cl.
USPC .................................. 716/54; 716/51; 716/53

(58) Field of Classification Search
None
See application file for complete search history.

(56) References Cited

U.S. PATENT DOCUMENTS

| | | | |
|---|---|---|---|
| 6,205,818 B1 | 3/2001 | Seward, III | |
| 6,811,934 B2 * | 11/2004 | Baggenstoss | 430/5 |
| 6,821,682 B1 | 11/2004 | Stearns et al. | |
| 6,844,272 B2 | 1/2005 | Taylor et al. | |
| 6,858,537 B2 | 2/2005 | Brewer | |
| 7,001,697 B2 | 2/2006 | Park et al. | 430/5 |
| 7,241,539 B2 | 7/2007 | Kim et al. | 430/5 |
| 7,352,452 B2 | 4/2008 | Wegmann et al. | |
| 7,425,396 B2 * | 9/2008 | Gruss et al. | 430/22 |
| 7,459,242 B2 | 12/2008 | Zait et al. | 430/5 |
| 2002/0105649 A1 * | 8/2002 | Smith et al. | 356/401 |
| 2005/0069790 A1 * | 3/2005 | Gruss et al. | 430/22 |
| 2007/0065729 A1 | 3/2007 | Zait et al. | 430/5 |
| 2007/0224522 A1 | 9/2007 | Lee et al. | 430/5 |
| 2008/0033206 A1 | 2/2008 | Harris et al. | |
| 2012/0009511 A1 | 1/2012 | Dmitriev | |
| 2012/0154773 A1 * | 6/2012 | Beyer | 355/52 |

FOREIGN PATENT DOCUMENTS

| | | |
|---|---|---|
| DE | 10 2006 054 820 | 5/2008 |
| EP | 0628806 A2 | 12/1994 |
| EP | 1829052 B1 | 4/2008 |

OTHER PUBLICATIONS

J. A. Underhill, Overlay Precision for Micron Lithography, SPIE vol. 80 Developments in Semiconductor Microlithography pp. 85-94, 1976.*
U.S. Appl. No. 61/351,056, "A Method for Determining the Performance of a Photolithographic Mask", 35 pages filed Jun. 3, 2010.
U.S. Appl. No. 61/363,352, "Method and Apparatus for Correcting Errors of a Photolithographic Mask", 172 pages filed Jul. 12, 2010.

(Continued)

*Primary Examiner* — A. M. Thompson
(74) *Attorney, Agent, or Firm* — Fish & Richardson P.C.

(57) ABSTRACT

A method for minimizing errors of a plurality of photolithographic masks that serve for successively processing a substrate is provided. The method includes determining a reference displacement vector field, in which the reference displacement vector field correlates displacement vectors of the errors of the plurality of photolithographic masks. The method includes determining for each of the photolithographic mask a difference displacement vector field as a difference between the reference displacement vector field and the displacement vectors of the errors of the respective photolithographic mask, and correcting the errors for each of the photolithographic masks using the respective difference displacement vector field.

20 Claims, 15 Drawing Sheets

(56) References Cited

OTHER PUBLICATIONS

U.S. Appl. No. 61/389,382, "Method and Apparatus for the Determination of Laser correcting Tool Parameters", 47 pages filed Oct. 4, 2010.

U.S. Appl. No. 61/324,467, "Method and Apparatus for Modifying a Substrate Surface of a Photolithographic Mask", 55 pages filed Apr. 15, 2010.

L.N. Allen et al., "An ion figuring system for large optics fabrication", Proc. SPIE 1168, p. 33-50 (1989).

Martin Ams et al., "Investigation of Ultrafast Laser-Photonic Material Interactions: Challenges for Directly Written Glass Photonics", IEEE Journal of Selected Topics in Quantum Electronics, vol. 14, No. 5, pp. 1370-1381 (Sep./Oct. 2008).

Peter Bechtold et al., "Non-thermal Micro Adjustment Using Ultrashort Laser Pulses", Journal of Laser Micro/Nanoengineering, vol. 2, No. 3, pp. 183-188 (2007).

O.M. Efimov et al., "Color center generation in silicate glasses exposed in infrared femtosecond pulses", J. Opt. Soc. Am., vol. 15, p. 193-199 (1998).

F. Frost et al., "Large area smoothing of optical surfaces by low-energy ion beams", Thin Solid Films 459, p. 100-105 (2004).

E. N. Glezer et al., "3-D Optical Storage Inside Transparent Materials", Optics Letters, vol. 21, No. 24, pp. 2023-2025 (1996).

S.J. Hoskins, "Aspheric surface figuring of fused silica plasma assisted chemical etching", SPIE vol. 2542, Optomechanical and Precision Instrument Design, p. 220-230 (1995).

Y. Shimotsuma et al., "Nano-modification inside transparent materials by femtosecond pulse laser", Mod. Phys. Left. B, vol. 19, No. 5, p. 225-238, (2005).

Yasuhiko Shimotsuma et al., "Self-Organized Nanogratings in Glass Irradiated by Ultrashort Light Pulses", Physical Review Letters, vol. 91, No. 24, pp. 247405-1-247405-4 (Dec. 12, 2003).

Linards Skuja et al., "Laser-induced color centers in silica", SPIE, vol. 4347, pp. 155-168 (2001).

Alexander M. Streltsov et al., "Fabrication and analysis of a directional coupler written in glass by nanojoule femtosecond laser pulses", Optics Letters, vol. 26, No. 1, pp. 42-43 (Jan. 1, 2001).

John S. Taylor et al., "Specification, Fabrication, Testing, and Mounting of EUVL Optical Substrates", EUV Lithography, SPIE Press Monograph, vol. PM178, pp. 161-185 (2008).

R. S. Taylor et al., "Femtosecond laser erasing and rewriting of self-organized planar nanocracks in fused silica glass", Optics Letters, vol. 32, No. 19, pp. 2888-2890 (Oct. 1, 2007).

John S. Taylor et al., "Fabrication and Testing of Aspheres, Trends in Optics and Photonics (TOPS)," vol. XXIV, Optical Society of America, Washington D.C., pp. 187-192 (1999).

R.A. Jones, Ed., "Selected Papers on Computer-Controlled Optical Surfacing," vol. MS40, SPIE Press, Bellingham, WA (1991).

Oshemkov et al., "DUV Attenuation Structures in Fused Silica Induced Ultrashort Laser Radiation", Proc. CLEOE-IQEC, Munich 2007.

Reimer, Textbook "Scanning Electron Microscopy", Physics of Image Formation and Microanalysis, Second Edition, Springer Verlag, pp. 138 and 149, Oct. 1998.

* cited by examiner

METHOD AND APPARATUS FOR MINIMIZING OVERLAY ERRORS IN LITHOGRAPHY

CROSS-REFERENCE TO RELATED APPLICATION

Pursuant to 35 U.S.C. §120, this application claims priority to U.S. provisional application 61/448,253, filed on Mar. 2, 2011. The content of the above application is incorporated by reference in its entirety.

FIELD OF THE INVENTION

The present invention relates to the field of minimizing overlay errors in lithography.

BACKGROUND OF THE INVENTION

As a result of the steadily increasing integration density of semiconductor devices, photolithographic masks or templates for nanoimprint lithography have to transfer smaller and smaller features. To meet this demand, the actinic wavelength of the imaging tool has been reduced in steps of 436 nm and 365 nm to 193 nm. Furthermore, immersion lithography has been introduced to enlarge the numerical aperture of the projection systems. As a consequence, the mask manufacturing process has reached a very high degree of complexity accompanied with strongly enlarged costs. In the near future, reflective masks will be used for imaging using light of a wavelength of 13.5 nm.

Therefore, photolithographic mask blanks have to fulfil very tight specifications for transmission and reflection homogeneity, planarity, glass pureness and temperature expansion coefficient. In order to manufacture photolithographic masks with a sufficient yield, mask defects are removed by repair at the end of the manufacturing process. Nowadays even inadequate critical dimension (CD) and registration control parameters are corrected by innovative to post mask manufacturing techniques. Such correction methods are described in the U.S. provisional applications U.S. 61/351,056, U.S. 61/363,352 and U.S. 61/389,382 of the applicant, which are hereby incorporated herein in their entirety by reference.

The manufacturing process of integrated circuits requires a recurring application of a plurality of photolithographic masks, which is called a mask set. The mask set of an advanced semiconductor device can comprise up to 30 photolithographic masks. The mask transfer process by the exposure tool has to insure a perfect overlay of the printed resist features to the features patterned in preceding lithographic processes. A bad overlay can have serious impact on the chip yield, hence on the manufacturing costs.

The control of the overlay is therefore one of the critical processes in the integrated circuit (IC) manufacturing. In the following, the term microscopic device or simply device is used for all devices fabricated on semiconducting wafers, such as ICs, micro-electromechanical systems (MEMS) including sensors, detectors and displays and photonic integrated circuits (PICs) including lasers and photodiodes.

The term overlay describes the accuracy of placing features of two succeeding lithographic processes on top of each other. Overlay measurements are performed at specifically designed overlay targets, which are placed within the active area of the mask, and which are transferred together with the IC feature to contents. Typical overlay targets are box-in-box or bar-in-bar feature arrangements. The overlay error measurement is performed with specifically constructed optical tools, which are capable to determine the offset of the center of gravity of layer targets printed consecutively on top of each other.

DE 10 2006 054 820A1 and U.S. 61/363,352 disclose a method to correct residual pattern placement errors of photolithographic masks. This process is denoted as registration correction (RegC) process. It is based on irradiating the quartz carrier or the quartz substrate of a mask with light pulses of a femtosecond laser. Mask residual errors cannot be removed by linear correction such as field magnification, translation and field rotation adaptations of the scanner and stepper, respectively. The residual mask placement error correction is performed by writing a placement error distribution dependent density of laser pulses, also called pixel density. Writing the pixels results in a small local lateral expansion of the quartz carrier, hence in a reduction of the placement errors in case of an appropriately determined pixel density distribution.

A mathematic-physical model to determine the appropriate pixel distribution is described in U.S. provisional application 61/363,352. It further demonstrates the opportunity of doing both, mask transmission uniformity and pattern placement accuracy improvements.

Presently, as described in the above mentioned documents, the correction of pattern placement errors is separately performed for each photolithographic mask of a set of masks, i.e. independent from placement errors on other masks of the same mask set. In more detail, the pattern placement errors of each mask or of each template are corrected relative to a virtual optimum, which is given by an orthogonal coordinate system, determined from the position of the alignment marks on the mask, or alternatively by a root-mean-square based optimization process of the pattern placement errors determined in the active area of the mask. The minimization of overlay errors by individually correcting the pattern placement errors of each mask relative to this virtual optimum is a complex and thus time consuming process. In particular, the correction of displacement vectors having large magnitudes is difficult to perform using the RegC process and may additionally newly introduce further errors in the substrate of the respective mask.

Moreover, this procedure may not be optimal for minimizing the contribution of the individually corrected photolithographic masks of the mask set to the overlay error on the wafer, as the pattern placement errors of different photolithographic masks of the mask set are considered isolated from the other members of the mask set.

It is therefore one object of the present invention to provide a method and an apparatus for minimizing overlay errors to avoiding at least in part the above mentioned problems.

SUMMARY OF THE INVENTION

According to a first aspect of the invention, a method for minimizing errors of a plurality of photolithographic masks, wherein the plurality of photolithographic masks serving for successively processing a substrate, comprises determining a reference displacement vector field, the reference displacement vector field correlates displacement vectors of the errors of the plurality of photolithographic masks, determining for each of the photolithographic mask a difference displacement vector field as a difference between the reference displacement vector field and the displacement vectors of the errors of the respective photolithographic mask, and correcting the errors for each of the photolithographic masks using the respective difference displacement vector field or the reference displacement vector field.

In a further aspect, overlay errors are minimized by correlating displacement vectors of pattern placement errors and correcting pattern placement errors.

In order to reduce the overall error correction effort, the defined method does not correct the pattern placement errors of each mask separately and independently from the other masks of the mask set, but takes the pattern placement errors of the other masks of the mask set into account. It only to corrects the deviations of the pattern placement errors of each mask from a reference distribution of placement errors which can be denoted by the term reference displacement vector field. Since the inventive method corrects deviations of each mask from such a reference displacement vector field, it prevents the correction of pattern placement errors having displacement vectors with a large magnitude. Therefore, the inventive method is well suited for a production process having a high throughput.

In another aspect, correlating of the displacement vectors comprises averaging of the displacement vectors of the plurality of photolithographic masks.

This embodiment of the inventive method is easy to perform as the displacement vectors of placement errors of various masks of the mask set are correlated by forming an average displacement vector at each measurement position of the mask from the displacement vectors of the various masks of the mask set. The collection of the average displacement vectors is the reference displacement vector field. In a RegC process the deviations of each mask from the reference displacement vector field are corrected.

In a further aspect, correlating of the displacement vectors comprises determining difference displacement vectors depending on a position at the photolithographic mask as a difference of the displacement vectors of two different masks, determining an average displacement value by averaging the to norms of the difference displacement vectors across an area of the photolithographic mask, determining a maximum displacement value as the maximum of the norms of the difference displacement vectors across an area of the photolithographic masks, defining a weighted average comprising the average displacement value, the maximum displacement value and weighting parameters, determining a weighted averaged displacement value for each photolithographic mask by averaging the weighted average with respect to the plurality of photolithographic masks, and determining the reference displacement vector field as the displacement vector field of the photolithographic masks having the lowest weighted averaged displacement value of the plurality of photolithographic masks.

This embodiment of the inventive method uses two weighting parameters to give the user the possibility to influence the pattern placement correction process. The user can decide if a small average displacement value has a higher priority than the reduction of the magnitude of the largest displacement vector or vice versa. The error correction process minimizes the deviations of the displacement vectors of the pattern elements with respect to the reference mask using the respective difference displacement vector fields.

This embodiment of the inventive method balances the effort for the reduction of the overlay error, i.e. the necessary writing of pixels in the various masks, with the degree of the overlay error correction.

In the present application the norm of a vector, i.e. the absolute value of a vector, or in other words its magnitude, or its length means the square root of the sum of the squared components $x_i (|\vec{x}| = \sqrt{x_1^2 + ... + x_n^2})$.

According to another aspect, correlating of the displacement vectors further comprises correlating of simulated displacement vectors, and/or repeating the steps described above until the lowest weighted averaged displacement value fulfils a quality criterion.

In the first two embodiments, the inventive method is applied to pattern placement errors determined from measurements of registration errors. In a third exemplified embodiment, the inventive method is employed to a correction displacement vector field determined from a RegC simulation without having performed a RegC process on the masks of the mask set. Thus, this third embodiment uses the pattern placement correction data determined in a RegC simulation in order to determine registration correction data by simulation which minimize the effort of the registration correction process of the individual masks in a subsequent RegC process.

Similar to the second embodiment, a reference correction displacement vector field is determined. But, the procedure of the determination of the reference correction displacement vector field is done in an iteration process until an to optimization parameter fulfils the stop criterion. The differences of the individual masks of the mask set from the finally determined reference correction displacement vector field are then corrected with a RegC process.

In another aspect, the quality criterion comprises a predetermined threshold and/or an increase of the lowest weighted averaged displacement value in successive iteration steps.

A further aspect comprises determining of pattern placement errors for each of the plurality of photolithographic masks. According to a further aspect, the pattern placement errors are measured at the photolithographic mask. In still a further aspect, the pattern placement errors are measured at the pattern elements at a photoresist pattern printed on a substrate.

The registration errors can be measured directly on the respective mask. Alternatively, the registration errors of a mask can be deduced from measurements at the printed pattern elements at the photoresist pattern on a substrate which comprises for example a wafer. This alternative method to determine the placement errors also comprises contributions of the exposure system projection optics to feature displacements caused by imperfections of the projection system.

According to a further aspect, correcting the pattern placement errors comprises using a femtosecond laser source to locally vary a mass density of a substrate of the photolithographic mask.

In another aspect, the femtosecond laser source is used to control minimizing the difference displacement vector field of each photolithographic mask by locally varying a mass density, or to perform a variation of the mass density of the substrate of the photolithographic mask in order to minimize displacement vectors relative to the reference displacement vector field. In a further aspect, correcting the pattern placement errors does not introduce a variation of the optical transmission across the photolithographic mask. According to still another aspect, correcting the pattern placement errors simultaneously corrects for optical transmission errors of the photolithographic mask.

One of the advantages of an appropriately chosen RegC process is that the correction of registration errors does not introduce other errors, in particular optical transmission errors in a mask substrate. On the contrary, a specifically designed RegC process can be used to simultaneously correct registration and optical transmission errors.

In a further aspect, correcting the pattern placement errors comprises locally varying a mass density of the substrate of the photolithographic mask in an active area of the photolithographic mask and/or in a non-active area of the substrate of the photolithographic mask.

Reducing the pattern displacement errors in the active area of the photolithographic masks is very effective. On the other hand, the flexibility of the error correction process is enhanced if the writing of pixels is not restricted to the active area.

In still another aspect, a subset of the plurality of photolithographic masks is used for minimizing pattern placement errors.

In a further aspect, minimizing overlay errors asymmetrically corrects pattern placement errors of the photolithographic masks with respect to a first direction and a second direction, wherein the first and the second directions are preferably perpendicular to each other. In still another aspect, minimizing overlay errors uses a first set of weighting parameters for the first direction and a second set of weighting parameters for the second direction, wherein the first and the second set of weighting parameters having different numerical values.

In another aspect, the plurality of photolithographic masks comprises a plurality of transmissive or reflective photolithographic masks or a plurality of templates for the nanoimprint lithography.

The generation of microscopic devices on substrates, which rely on a plurality of any kind of masks, has the problem to align the pattern elements of different masks on top of each other. Thus, the inventive method can be used to solve or at to least significantly reduce the overlay errors occurring in these fabrication processes.

According to another aspect, each position $x_i, y_i$ of the reference displacement vector field $D^{Mean}(x_i, y_i)$ is calculated according to:

$$D^{Mean}(x_i, y_i) = \frac{1}{M} \cdot \sum_{m=1}^{M} D_m(x_i, y_i),$$

where $D_m(x_i, y_i)$ is the displacement vector of the measured pattern placement error of the photolithographic mask m at the position $x_i, y_i$. In still a further aspect, the difference displacement vector field for photolithographic mask m at the position $x_i, y_i$ is determined by: $\Delta D_m(x_i, y_i) = D_m(x_i, y_i) - D^{Mean}(x_i, y_i)$, where $D^{Mean}(x_i, y_i)$ is the reference displacement vector field.

This example of the inventive method simply uses the arithmetic average of the displacement vector field of each mask as the reference displacement vector field. Each mask of the mask set is corrected with respect to this reference by minimizing the deviations (expressed in form of the difference displacement vector field) from the reference displacement vector field. This embodiment of the inventive method combines the large amount of overlay error correction with a reasonable effort for the error correction, i.e. the minimum number of pixels which have to be written in the various masks of the mask set.

It is a target of the exemplary embodiments of the inventive method discussed in this application to reduce the difference to displacement vector field to zero, so that all photolithographic masks in the mask set have the displacement vectors of the reference displacement vector field. However, it is not the intention of the inventive method to reduce the pattern placement errors of each photolithographic mask to zero with respect to an ideal orthogonal coordinate system given for each single mask. Such a correction process would require a large error correction effort as there are often individual displacement vectors on the various masks having a large magnitude. Moreover, as such a process minimizes the pattern placement errors of each mask with respect to a perfect mask; it does not consider placement errors of another mask of the mask set.

The present invention is based on the assumption that the contribution of each of the photolithographic masks of the mask set to the overlay error is low, but that there is a correlation of the pattern errors of the various masks of a mask set with respect to the overlay error. Therefore, the inventive method does not refer to perfect individual masks, but correlates pattern placement errors of individual masks of a mask set. Thus, it accepts pattern placement errors of the reference displacement vector field, but corrects deviations from the reference displacement vector field. This approach does not need the huge effort of correcting each mask individually with respect to its perfect pattern. Nevertheless, the inventive method may result in a lower overlay error of the mask set as it takes the relative pattern placement errors of all or of a portion of the photolithographic masks of a mask set into account.

In still an alternative aspect, the reference displacement vector field $D^{Ref}(x_i, y_i)$ is determined by calculating a difference displacement vector $\Delta D_{mn}(x_i, y_i)$ at the position $x_i, y_i$ as a difference of the displacement vectors $D_m(x_i, y_i)$ of the photolithographic mask m and $D_n(x_i, y_i)$ of the photolithographic mask n according to: $\Delta D_{mn}(x_i, y_i) = D_m(x_i, y_i) - D_n(x_i, y_i)$, calculating an average displacement value of the norms of the difference displacement vectors $\Delta D_{mn}(x_i, y_i)$ according to:

$$\Delta D_{mn}^{Avr} = \frac{1}{Q} \cdot \sum_{i=1}^{Q} |\Delta D_{mn}(x_i, y_i)|,$$

calculating a maximum displacement value $\Delta D_{mn}^{Max}$ of the norms of the differences of the displacement vectors $\Delta D_{mn}(x_i, y_i)$ according to:

$$\Delta D_{mn}^{Max} = \max_{1 \leq i \leq Q}(|\Delta D_{mn}(x_i, y_i)|),$$

defining a weighted average $\Delta D_{mn}^{Sum}$ of the average displacement value $\Delta D_{mn}^{Avr}$ and the maximum displacement value $\Delta D_{mn}^{Max}$ according to:

$$\Delta D_{mn}^{Sum} = \frac{1}{A+B} \cdot (A \cdot \Delta D_{mn}^{Avr} + B \cdot \Delta D_{mn}^{Max}),$$

where A and B are weighting parameters, calculating a weighted averaged displacement value $\Delta D_m^{Avr}$ for each photolithographic mask m from the weighted average $\Delta D_{mn}^{Sum}$ with respect to all other photolithographic masks n according to:

$$\Delta D_m^{Avr} = \frac{1}{(M-1)} \cdot \sum_{\substack{n=1 \\ n \neq m}}^{M} \Delta D_{mn}^{Sum},$$

and determining a reference displacement vector field $D^{Ref}(x_i,y_i)$ as the displacement vector field $D_m(x_i,y_i)$ of the photolithographic mask m having the lowest weighted averaged displacement value of all photolithographic masks according to:

$$D^{Ref} = \underset{1 \leq m \leq M}{\text{Min}} (\Delta D_m^{Avr})$$

and assigning: $D^{Ref}(x_i,y_i) = D_m(x_i,y_i)$.

According to another aspect, the difference displacement vector field of the photolithographic mask m is determined by: $\Delta D_m(x_i,y_i) = D^{Ref}(x_i,y_i) - D_m(x_i,y_i)$, where $D^{Ref}(x_i,y_i)$ is the reference displacement vector field.

In a further aspect, A is zero or B is zero.

A further alternative aspect comprises (a) simulating a corrected displacement vector field for each photolithographic mask comprising residual displacement errors after application of state-of-the art correction processes such as RegC, and setting an iteration index to a starting value; (b) determining difference correction displacement vectors as a difference of the corrected displacement vectors of two different photolithographic masks for each combination of photolithographic masks; (c) determining for each photolithographic mask average difference correction displacement vectors by averaging the norms of the difference correction displacement vectors with respect to other photolithographic masks; (d) determining for each photolithographic mask an average correction displacement value by averaging the average difference correction displacement vectors; (e) determining for each photolithographic mask a maximum correction displacement value as the largest numerical value of the average difference to correction displacement vectors; (f) defining for each photolithographic mask an optimization parameter as a weighted sum of the average correction displacement value, the maximum correction displacement value and weighting parameters, wherein the optimization parameter depends on the iteration index; (g) determining an intermediate correction displacement vector field as the correction displacement vector field of the photolithographic mask having the lowest numerical value of the optimization parameter; (h) if the iteration index has the starting value: taking the intermediate correction displacement vector field as the reference correction displacement vector field, calculating for each photolithographic mask a difference vector field as the difference between a displacement vector field and the reference correction displacement vector field, comparing the optimization parameter with a predetermined threshold, if the optimization parameter is below a threshold: correcting the errors for each photolithographic mask using the respective difference displacement vector field, and ending, and if the optimization parameter is above the threshold: increasing the iteration index by one unit; (i) if the iteration index has not the starting value: comparing the optimization parameter with the threshold, if the optimization parameter is below the threshold, taking the intermediate correction displacement vector field as the reference correction displacement vector field, calculating for each photolithographic mask a difference displacement vector field as the difference between the displacement vector field and the reference correction displacement vector field, correcting the errors for each photolithographic mask using the to respective difference displacement vector field, and ending; (j) if the optimization parameter has not the starting value and if the optimization parameter is larger than the threshold: comparing the optimization parameter of the previous iteration step with the optimization parameter of the present iteration step, if the optimization parameter of the present iteration step is larger than the optimization parameter of the previous iteration step, taking the intermediate correction displacement vector field of the previous iteration as the reference correction displacement vector field, calculating for each photolithographic mask a difference displacement vector field as the difference between the displacement vector field and the reference correction displacement vector field, correcting the errors for each photolithographic mask using the respective difference displacement vector field, and ending; (k) if the optimization parameter has not the starting value and if the optimization parameter of the present iteration step is below the optimization parameter of the previous iteration step: taking the intermediate correction displacement vector field as the reference correction displacement vector field, calculating for each photolithographic mask a difference displacement vector field as the difference between the displacement vector field and the reference correction displacement vector field, and increasing the iteration index by one unit; (l) simulating the difference displacement vector field for each photolithographic mask to determine a difference correction displacement vector field; (m) determining difference correction displacement vectors as a difference of difference correcting displacement vectors of two different to photolithographic masks for each combination of the photolithographic masks; and (n) repeating steps c. to k.

This embodiment of the inventive method uses the simulation to find difference correcting displacement vector fields which reduce placement errors of (M–1) masks of the mask set in order to reduce the overlay error of the mask set to a minimum. It is based on the assumption that a RegC simulation can predict the effects of the writing of pixels in the substrates of photolithographic masks. Consequently, a computer system can be used for optimizing the effect of a pattern placement correction process on the overlay error of the mask set, by considering the correlation of the pattern placement errors of different masks of the mask set. Then, similar to the previous embodiments the deviations of the registration errors of the various masks from the reference correction displacement vector field are minimized by performing a RegC process using the respective difference displacement vectors fields of the masks.

In still a further aspect, for k=1 a difference correction displacement vector $\Delta D_{mn}^{Corr}(x_i,y_i)$ at the position $x_i,y_i$ is the difference of the correcting displacement vectors $D_m^{Corr}(x_i,y_i)$ of the photolithographic mask m and $D_n^{Corr}(x_i,y_i)$ of the photolithographic mask n according to: $\Delta D_{mn}^{Corr}(x_i,y_i) = D_m^{Corr}(x_i,y_i) - D_n^{Corr}(x_i,y_i)$, and for k≠1 the difference correction displacement vector $\Delta D_{mn}^{Corr}(x_i,y_i)$ is the difference of the difference correcting displacement vectors $\Delta D_m^{Corr}(x_i,y_i)$ of the photolithographic mask m and $\Delta D_n^{Corr}(x_i,y_i)$ of the photolithographic mask n according to: $\Delta D_{mn}^{Corr}(x_i,y_i) = \Delta D_m^{Corr}(x_i,y_i) - \Delta D_n^{Corr}(x_i,y_i)$.

In yet another aspect, an average correction displacement vector $\Delta D_m^{Corr,Avr}(x_i,y_i)$ of the photolithographic mask m with respect to all photolithographic masks n is determined from the norms of the difference correction displacement vectors $\Delta D_{mn}^{Corr}(x_i,y_i)$ according to:

$$\Delta D_m^{Corr,Avr}(x_i, y_i) = \frac{1}{(M-1)} \cdot \sum_{n=1, n \neq m}^{M} |\Delta D_{mn}^{Corr}(x_i, y_i)|.$$

According to still a further aspect, determining an average correction displacement value $\Delta D_m^{Corr,Avr}$ for the photolithographic mask m comprises averaging of the average correction displacement vectors $\Delta D_m^{Corr,Avr}(x_i,y_i)$ across an area of the photolithographic mask m according to:

$$\Delta D_m^{Corr,Avr} = \frac{1}{Q} \cdot \sum_{i=1}^{Q} \Delta D_m^{Corr,Avr}(x_i, y_i).$$

In another aspect, determining a maximum correction displacement value $\Delta D_m^{Corr,Max}$ comprises determining a maximum of all average correction displacement vectors $\Delta D_m^{Corr,Avr}(x_i,y_i)$ of the photolithographic mask m according to:

$$\Delta D_m^{Corr,Avr} = \underset{1 \leq i \leq Q}{\text{Max}}(\Delta D_m^{Corr,Avr}(x_i, y_i)).$$

In a further aspect, an optimization parameter $P_m(k)$ for the photolithographic mask m comprises the average correction displacement value $\Delta D_m^{Corr,Avr}$ and the maximum correction to displacement value $\Delta D_m^{Corr,Max}$ according to:

$$P_m(k) = \frac{1}{A+B} \cdot (A \cdot \Delta D_m^{Corr,Avr} + B \cdot \Delta D_m^{Corr,Max}),$$

where A and B are weighting parameters and k is the iteration index beginning with k=1.

According to a beneficial aspect, the intermediate correction displacement vector field $D_{int}(x_i,y_i)$ is the correction displacement vector field of the photolithographic mask $D_m^{Corr}(x_i,y_i)$ having the lowest numerical value of the optimization parameter $P_m(k)$ for all photolithographic masks m according to: $D_{int,k}(x_i,y_i)=D_m^{Corr}(x_i,y_i)$.

In a further aspect, if the optimization parameter $P_m(k)$ is below a predetermined threshold T the reference correction displacement vector field is defined by the intermediate correction displacement vector field according to: $D^{Corr,Ref}(x_i,y_i)=D_{int,k}(x_i,y_i)$, and if the optimization parameter of a previous iteration step is smaller than the optimization parameter of the present iteration step the reference correction displacement vector field is: $D^{Corr,Ref}(x_i,y_i)=D_{int,k-1}(x_i,y_i)$.

In yet another aspect, the difference displacement vector field $\Delta D_m(x_i,y_i)$ is the difference of the displacement vector field $D_m(x_i,y_i)$ and the reference correction displacement vector field $D^{Corr,Ref}(x_i,y_i)$ according to: $\Delta D_m(x_i,y_i)=D_m(x_i,y_i)-D^{Corr,Ref}(x_i,y_i)$.

A beneficial aspect comprises simulating the difference displacement vector fields $\Delta D_m(x_i,y_i)$ for each photolithographic mask m to obtain difference correcting displacement vector fields $\Delta D_m^{Corr}(x_i,y_i)$.

According to another aspect, if k=1 and if: (a) $P_m(1)<T$: ending; and (b) $P_m(1) \geq T$: k=k+1 and performing the next iteration step.

Furthermore, according to still a further beneficial aspect, when k≠1 and if: (a) $P_m(k)<T$: correcting the errors for each photolithographic mask using the respective difference displacement vector field and ending; (b) $P_m(k)<P(k-1)$: k=k+1 and performing the next iteration step; and (c) $P_m(k) \geq P_m(k-1)$: determining the reference displacement vector field as $D^{Corr,Ref}(x_i,y_i)=D_{int,k-1}(x_i,y_i)$, correcting the errors for each photolithographic mask using the respective difference displacement vector field and ending.

Finally, in still another aspect, an apparatus for minimizing errors of a plurality of photolithographic masks, wherein the plurality of photolithographic masks serving for successively processing a wafer, comprises at least one computing means adapted for determining a reference displacement vector field, the reference displacement vector field correlates displacement vectors of the errors of the plurality of photolithographic masks, determining for each of the photolithographic masks a to difference displacement vector field as a difference between the reference displacement vector field and the displacement field of the pattern placement errors, and at least one laser system adapted for correcting errors for each of the photolithographic masks using the respective difference displacement vector field or the reference displacement vector field.

Further aspects of the invention are described in further dependent claims.

DESCRIPTION OF THE DRAWINGS

In order to better understand the present invention and to appreciate its practical applications, the following Figures are provided and referenced hereafter. It should be noted that the Figures are given as examples only and in no way limit the scope of the invention.

DETAILED DESCRIPTION OF PREFERRED EMBODIMENTS

U.S. provisional application 61/363,352 and U.S. patent application publication US 2012/0009511 A1, both incorporated by reference, describe in detail how pattern placement errors can be simulated and corrected by writing of a respective arrangement of pixels in the substrate of photolithographic masks. This process is in the following called RegC process.

This section begins with a brief description of an apparatus which may be used for the measurement of pattern placement errors of the various masks of a mask set. Then, the apparatus used for the correction of deficiencies of the substrate of the photolithographic masks or of the templates for the nanoimprint technique is presented. In the second part, three exemplary embodiments of the inventive method are presented to illustrate the present invention.

In the following, the present invention will be described hereinafter in more details with reference to accompanying Figures, in which exemplary embodiments of the invention are illustrated. However, the present invention may be embodied in different forms and should not be construed as limited to the embodiments set forth herein. Rather, these embodiments are provided so that this disclosure will be thorough and will convey the scope of the invention to persons skilled in the art.

Figure 1:
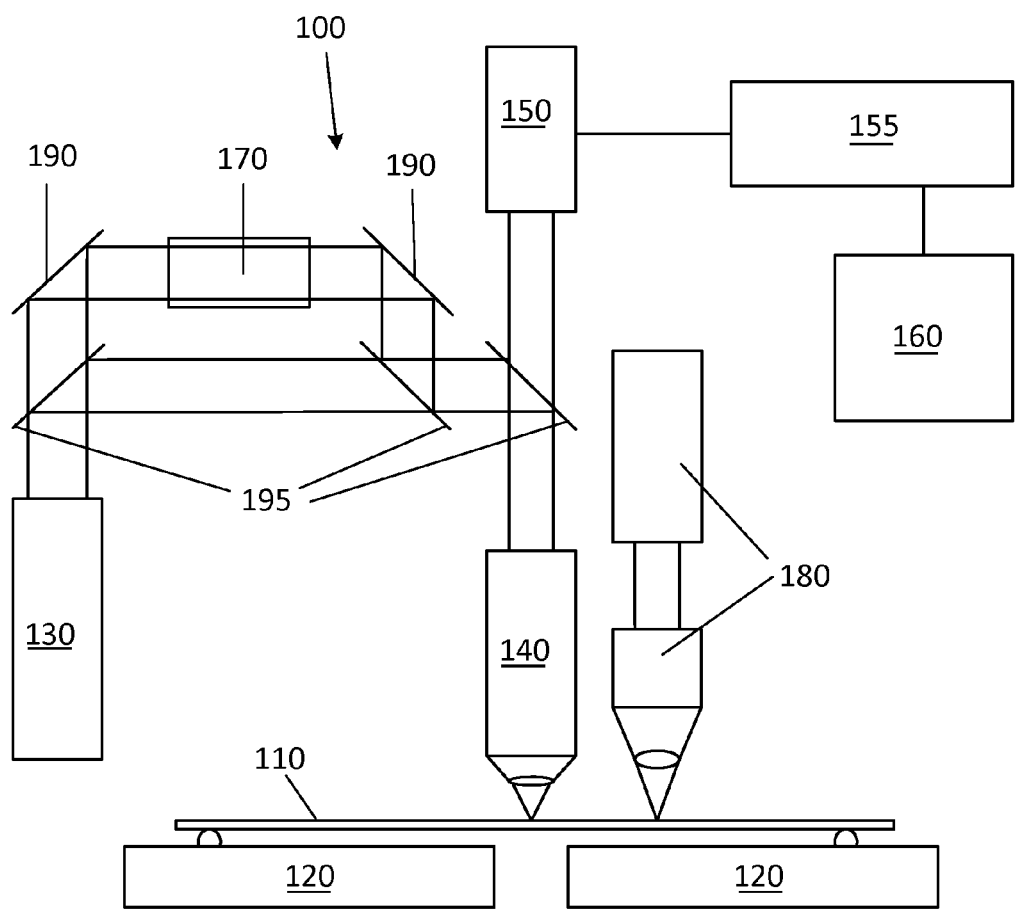
FIG. 1 schematically represents a block diagram of some of the major components of an apparatus used to measure pattern placement errors.

FIG. 1 shows a functional sketch of a registration metrology tool 100 which is used for pattern placement errors measurements. A photolithographic mask 110 is supported by a high precision stage 120. The stage 120 is actively controlled in order to adjust the movement of the stage in the plane perpendicular to the laser beam in the sub-nanometer range. As a light source 130 an excimer laser is used emitting light in the DUV (deep ultraviolet) wavelength range, at approximately 193 nm. This means that light of the same wavelength is used for the inspection and the illumination of the photolithographic mask 110, as most masks are presently illuminated with a 193 nm light source. Hence, the registration metrology tool 100 takes the effect of material properties properly into account. However, it has to be stressed that the apparatus 100 of FIG. 1 is not limited to light sources emitting in the DUV range; rather any light source 130 can be used in FIG. 1 which emits light in the spectral range from DUV to the visible spectrum.

A CCD (charge-coupled device) camera 150 is used as a detector device which measures the light reflected from the photolithographic mask 110. The CCD camera 150 sends its signal to the signal processing unit 155 which calculates an image of the signal detected by the CCD camera 150.

A computer system 160 can display the image calculated by the signal processing unit 155 and may store the measured data. Further, the computer system 160 may contain algorithms, realized in hardware and/or software, which allow extracting control signals from the experimental data. The control signals control the writing of an arrangement of pixels in the substrate of the photolithographic mask 110 by a laser system in order to correct the pattern placement errors of photolithographic mask 110 (cf. FIG. 2 below). Further, the computer system 160 may control the laser source 130, the high-precision stage 120, the lens 140, the CCD camera 150, and/or the AF system 170.

The registration metrology tool 100 has an autofocus (AF) system 170. Furthermore, the registration metrology tool 100 comprises an auxiliary optical system 180 for a coarse alignment of the pattern placement elements on the photolithographic mask 110.

A registration metrology tool 100 can also use other position marker detecting principles, for instance such based on scanning electron imaging.

Figure 2:
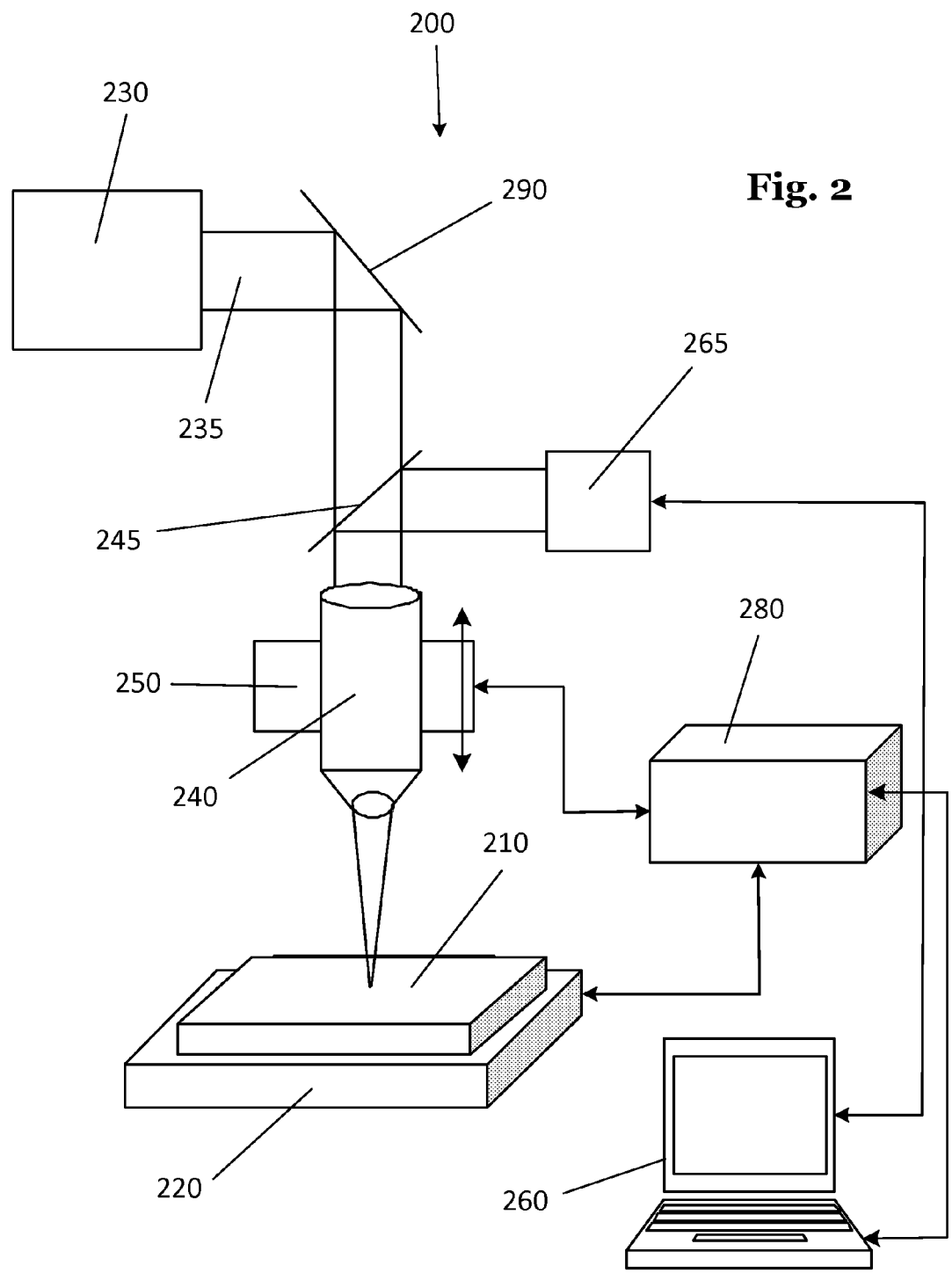
FIG. 2 schematically shows a block diagram of an apparatus used for correcting the pattern placement errors.

FIG. 2 depicts a schematic block diagram of an apparatus 200 which can be used to correct feature placement errors of photolithographic masks as well as of templates for the nanoimprint lithography. The apparatus 200 comprises a chuck 220 which can be moved in three dimensions. A photolithographic mask 210 or a template for the nanoimprint technique is fixed to the chuck 220 by using various techniques as for example mechanical clamping.

The apparatus 200 includes a pulsed laser source 230 which produces pulsed light beams. The laser source 230 is able to supply light pulses of variable dose and duration and shape.

A steering mirror 290 directs the pulsed laser beam 235 into a focusing lens 240. This lens focuses the pulsed laser beam 235 onto the quartz substrate of the photolithographic mask 210.

Typical technical parameters are a NA of the lens 240 of up to 0.9, a focal point spot diameter of about 1 µm and a maximum intensity of about $10^{20}$ W/cm².

The apparatus 200 also includes a controller 280 and a computer system 260 which manage the movement of the two-axis positioning stage of the sample holder 220 in the plane perpendicular to the laser beam (x and y directions). The controller 280 and the computer system 260 also control the movement of the lens 240 perpendicular to the plane of the chuck 220 (z direction) via the one-axis positioning stage 250 to which the lens 240 is fixed. It should be noted that other to embodiments of the apparatus 200 are possible.

The computer system 260 may be a microprocessor, a general purpose processor, a special purpose processor, a CPU (central processing unit), a GPU (graphic processing unit), or the like. It may be arranged in the controller 280, or may be a separate unit such as a PC (personal computer), a workstation, a mainframe, etc. The computer 260 may further comprise I/O (input/output) units like a keyboard, a touchpad, a mouse, a video/graphic display, a printer, etc. In addition, the computer system 260 may also comprise a volatile and/or a non-volatile memory. The computer system 260 may be realized in hardware, software, firmware, or any combination thereof. Moreover, the computer 260 may control the laser source 230 (not indicated in FIG. 2). The computer systems 160 of FIGS. 1 and 260 of FIG. 2 may be connected to exchange data. Moreover, the computer systems 160 and 260 may be combined in a single computer system (not shown in FIGS. 1 and 2).

Further, the apparatus 200 may also provide a viewing system including a CCD (charge-coupled device) camera 265 which receives light from an illumination source arranged in the chuck 220 via the dichroic mirror 245. The viewing system facilitates navigation of the photolithographic mask 210 to the target position. Further, the viewing system may also be used to observe the formation of a modified area on the substrate material of the mask 210 by the pulsed laser beam 235 of the light source 230.

In the following examples, the inventive method to minimize the overlay error of a mask set is discussed. Persons skilled in the art will appreciate that photolithographic masks are used here only for illustration purposes; the inventive method may for example also be applied to minimize the overlay errors of templates used in the nanoimprint lithography or comparable purposes.

Figure 3:
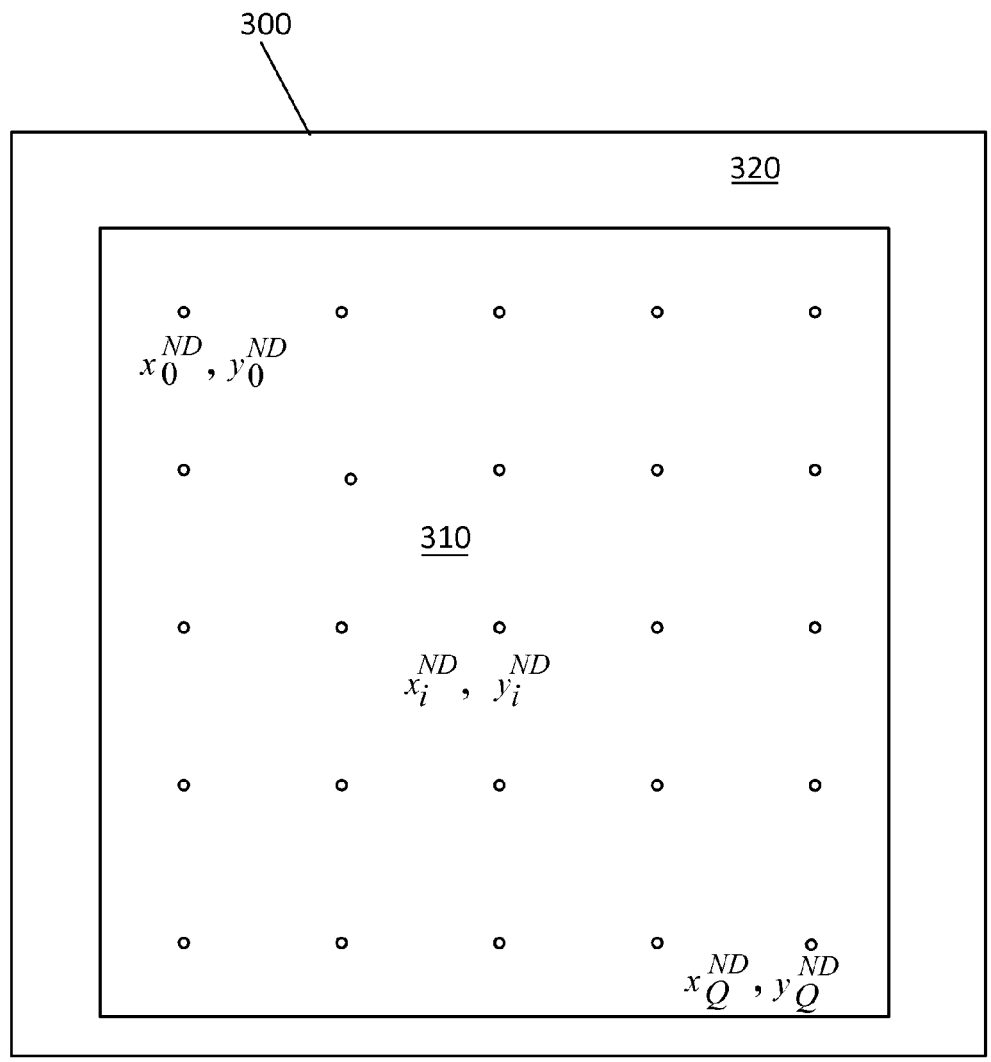
FIG. 3 schematically depicts a substrate of a to photolithographic mask of a mask set indicating positions at which the pattern placement errors are measured.

FIG. 3 schematically shows a top view of the substrate of photolithographic mask 300. The mask 300 may be a light-transmissive or a reflective mask. The active area 310 of the substrate of the mask 300 depicts a regular grid. The grid nodes determine the positions at which the registration metrology tool 100 of FIG. 1 measures the pattern displacement errors of the photolithographic mask 300. The number of grid nodes Q may be selected by the user and depends on the required accuracy of the pattern placement error measurement. At present, a reasonable numerical range for Q may be 30<Q<500. The inventive principle does not require measurements from regular grid nodes, an irregular distribution of measurements points across a mask can also be used.

The position of each grid node i is determined by $x_i^{ND}$, $y_i^{ND}$, where ND stands for non-disturbed or non-displaced, i.e. the predetermined reference position of a pattern placement element on the substrate of the photolithographic mask 300. The following consideration is restricted to a two-dimensional to (2D) approximation, i.e. displacements of the grid node i perpendicular to the area of the mask substrate are ignored. However, it has to be stressed that the application of the inventive method is not restricted to a 2D approximation. This approximation is used here to illustrate the inventive principle.

At the mask 300 of FIG. 3, the pattern placement error is detected in the active area 310 but not in the non-active area 320. This restriction is arbitrarily introduced here in order to keep the illustrative example simple. The registration metrology tool 100 of FIG. 1 can be applied to the overall mask 300. Further, apparatus 200 of FIG. 2 can also write pixels in the overall area 310 and 320 of the photolithographic mask 300.

Figure 4:
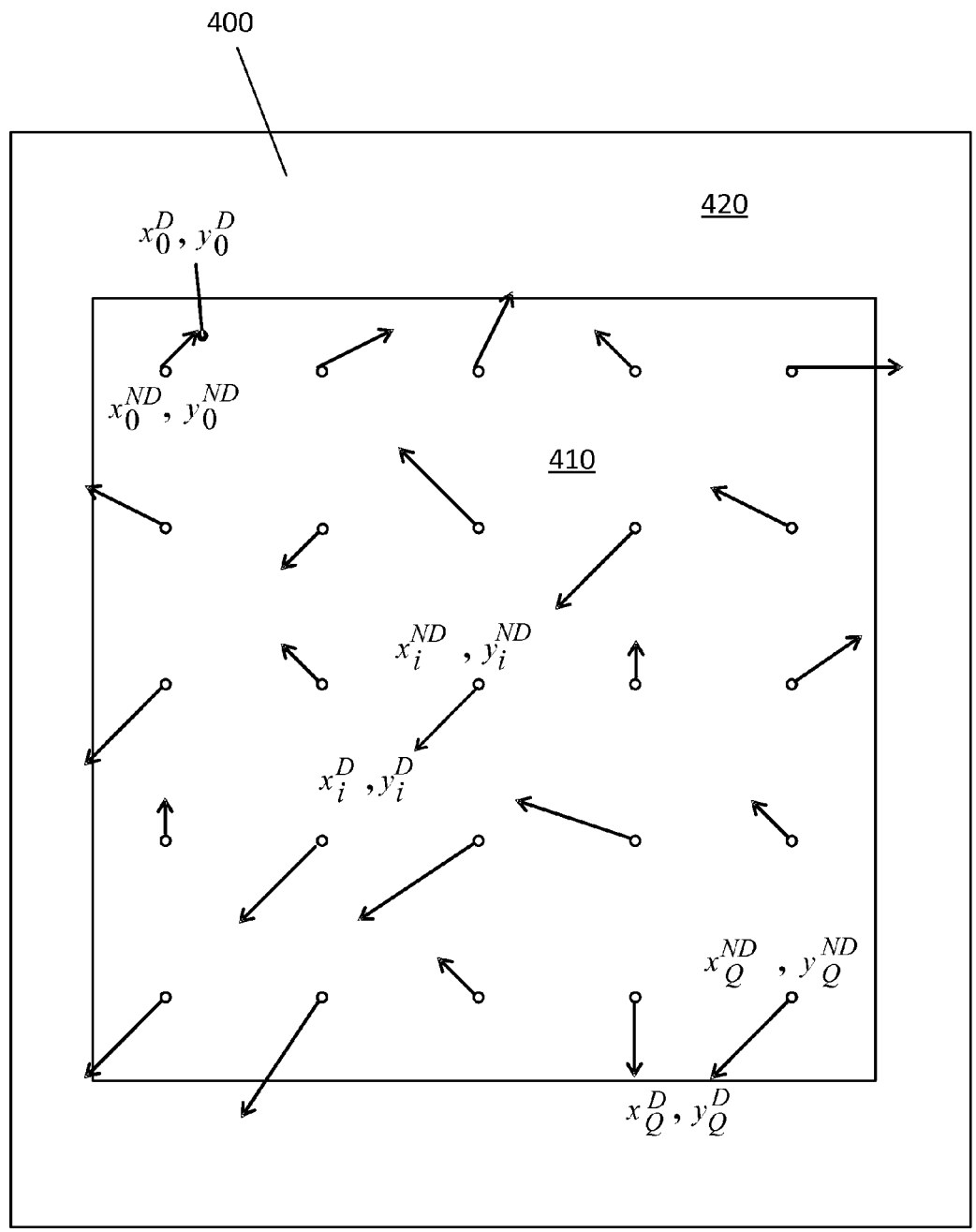
FIG. 4 schematically represents measured pattern placement errors symbolized by arrows of a first photolithographic mask in a mask set using the apparatus of FIG. 1.

FIG. 4 schematically shows the measured pattern placement errors detected at the grid nodes i of the photolithographic mask 300 of FIG. 3. The arrows indicate a displacement of a mask feature relative to the target position indicated by the node i. The length of the arrows represents the magnitude, the absolute value, or the norm. The arrow tip indicates the direction into which the grid node is shifted. The arrow tip of node i has the coordinates $x_i^D, y_i^D$, where D denotes the displacement of the feature at position i. Thus, the displacement vector D at the grid node i is given by:

$$D(x_i, y_i) = (x_i^D - x_i^{ND}, y_i^D - y_i^{ND}) \quad (1)$$

As can be seen from FIG. 4, both the directions of the displacement vectors and their absolute values are subject to random fluctuations across the area 310 of the mask 300.

The displacement vectors $D(x_i, y_i)$ of all grid nodes i may comprise a contribution which can be corrected by a global imaging transformation of a scanner or of a stepper, respectively. This contribution is additive to the remaining registration errors. Therefore, it can be removed at the beginning or at the end of the placement error correction process.

Figure 5:
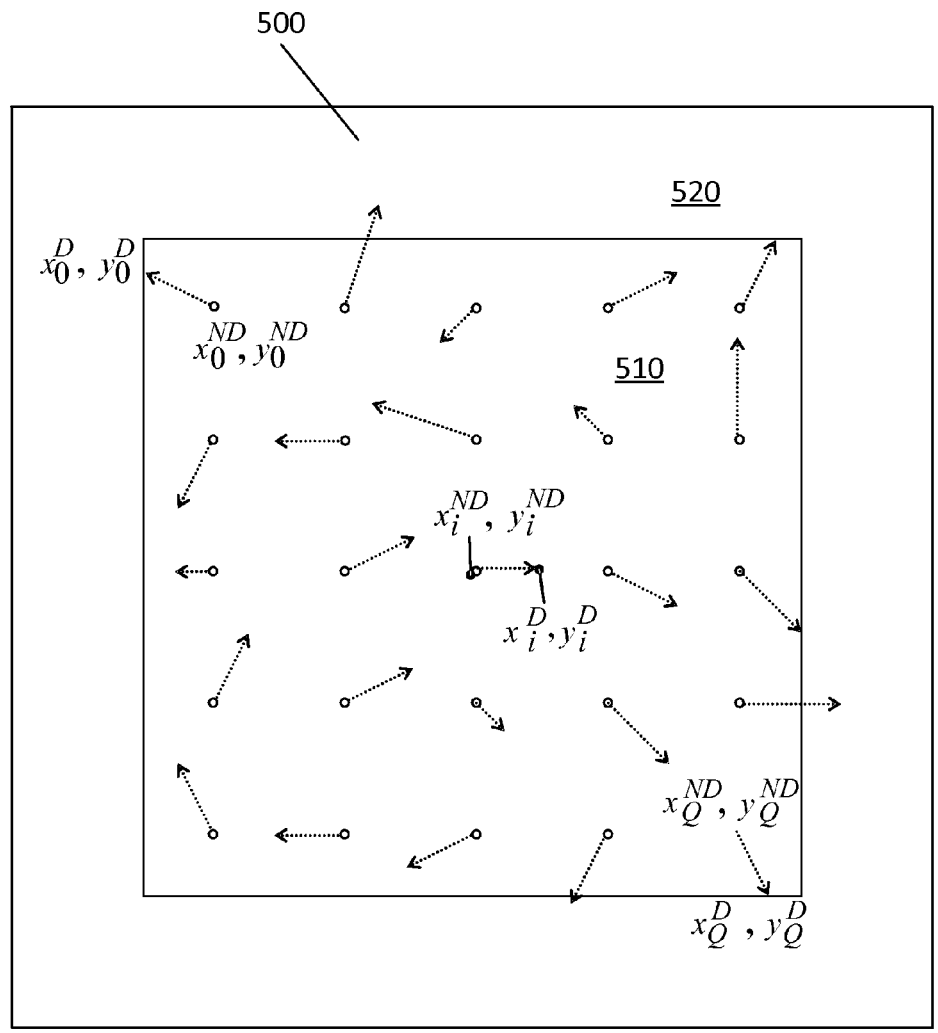
FIG. 5 schematically shows measured pattern placement errors symbolized by dotted arrows of a second mask of the mask set at the respective positions.

FIG. 5 shows the pattern placement errors of a second mask 500 of a mask set. The displacements of the pattern are again symbolized by (dotted) arrows. Again, a possible contribution of the pattern placement errors which can be corrected by a global imaging transformation has already been subtracted from the displacement vectors shown in FIG. 5. In order to discriminate the displacement vectors of the various masks in a mask set, the index m is introduced which denotes the number of the mask. For complex devices, the mask set may comprise of up to 30 different photolithographic masks, where M is the mask having the highest number. The generalisation of equation 1 can thus be expressed as:

$$D(x_i, y_i) = (x_i^D - x_i^{ND}, y_i^D - y_i^{ND})_m \quad (2)$$

Figure 6:
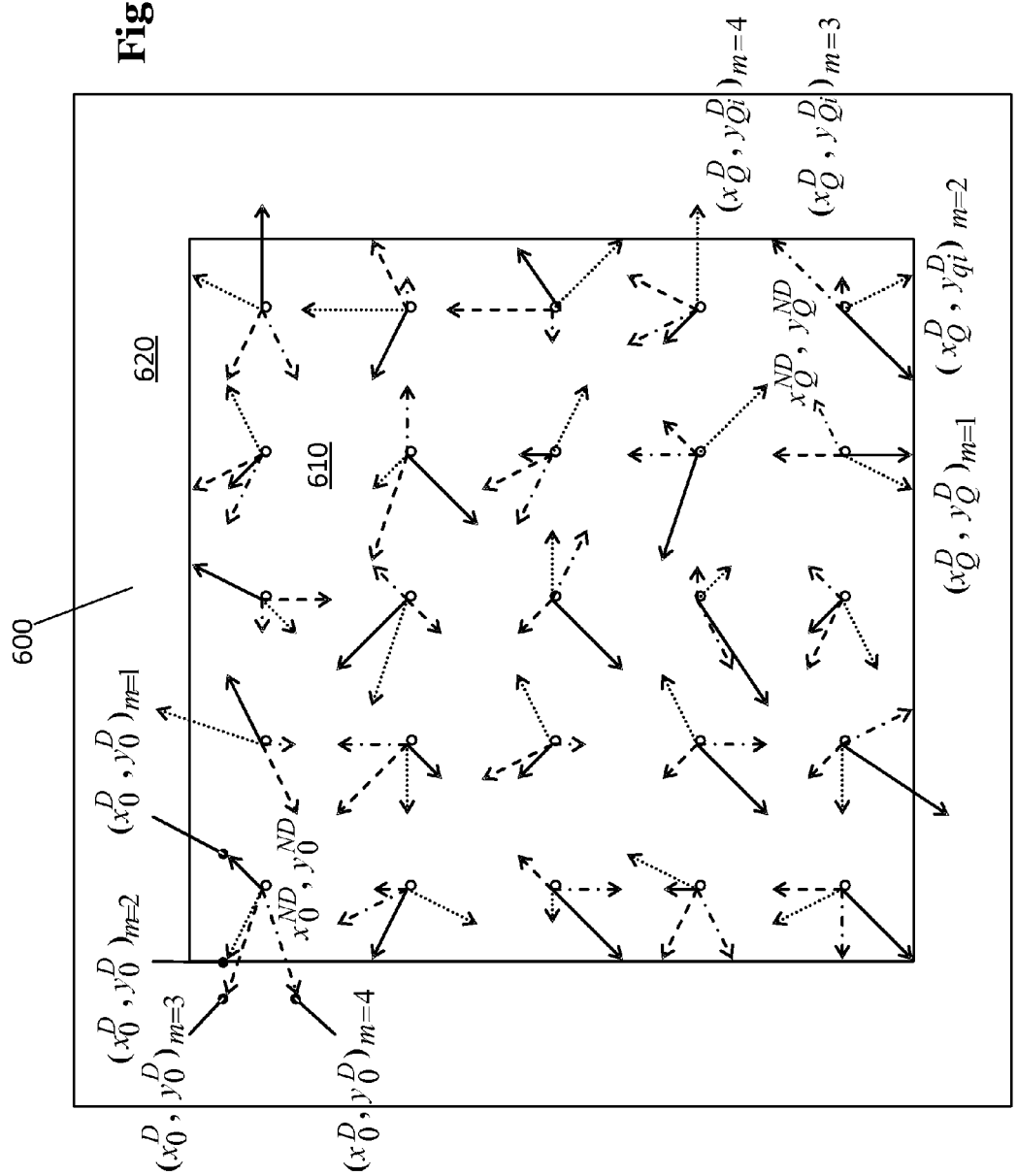
FIG. 6 schematically depicts the displacement vectors of a first (FIG. 4), a second (FIG. 5) and a third and a fourth mask of the mask set.

FIG. 6 schematically represents the displacement vectors of a first photolithographic mask 400 of FIG. 4, $D_1(x_i, y_i)$, of the second mask 500 of FIG. 5, $D_2(x_i, y_i)$, of a third, $D_3(x_i, y_i)$, and fourth photolithographic mask, $D_4(x_i, y_i)$ ($D_3(x_i, y_i)$ and $D_4(x_i, y_i)$ are not shown in any one of the previous Figures). The small number (M=4) is selected here in order to just illustrate the inventive principle. On the other hand, typically only a few masks of the mask set are overlay critical and need to be considered for registration evaluation and corrective treatment.

Figure 7:
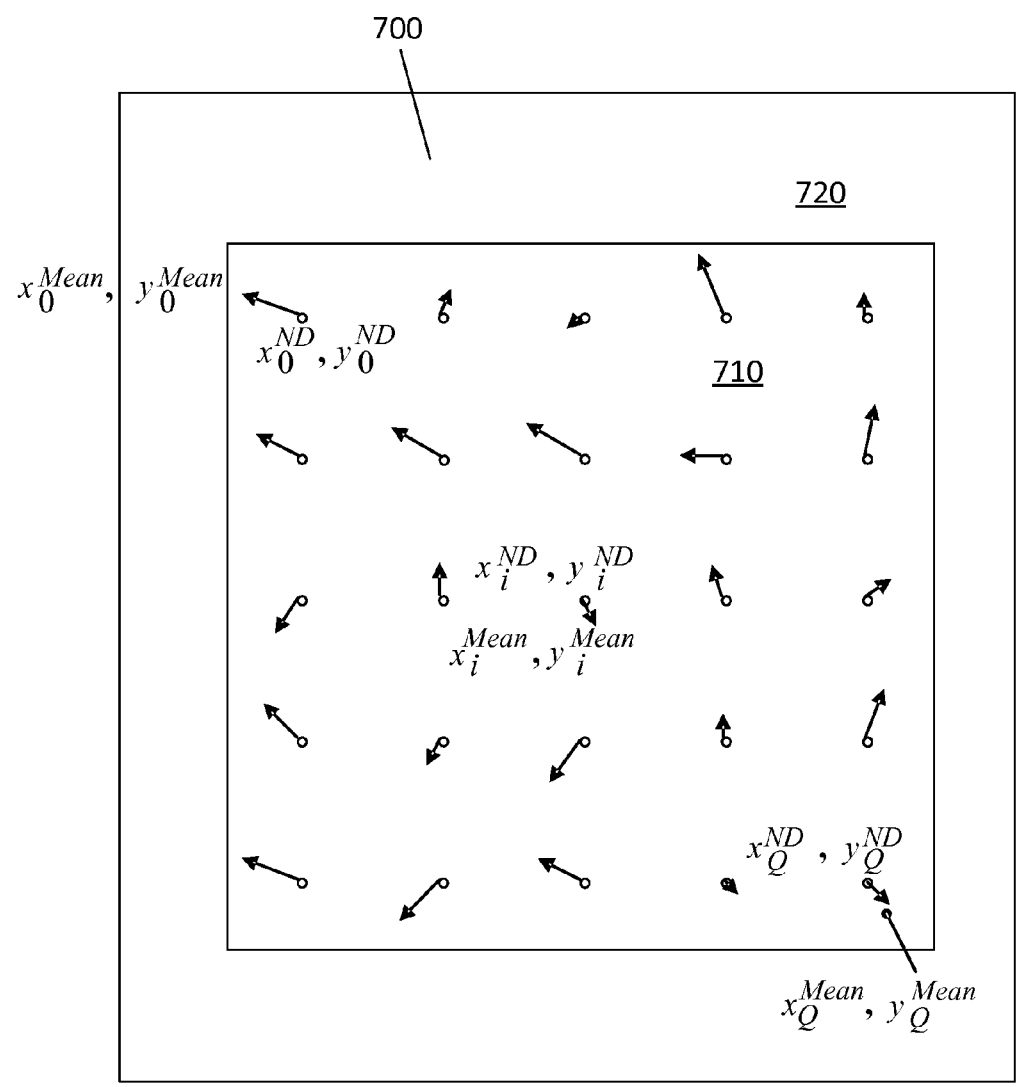
FIG. 7 schematically shows the mean of the displacement vectors of the four masks of FIG. 6.

FIG. 7 shows the mean displacement vectors $D^{Mean}(x_i, y_i)$ at each grid node i calculated from the displacement vectors $D_m(x_i, y_i)$ of the four photolithographic masks according to the equation:

$$D^{Mean}(x_i, y_i) = \frac{1}{4} \cdot \sum_{m=1}^{4} D_m(x_i, y_i) \quad (3)$$

As expected, FIG. 7 clearly demonstrates that the mean displacements vector $D^{Mean}(x_i, y_i)$ at each grid node i is significantly smaller than the displacement vectors of the individual masks m as indicated in FIG. 4 to FIG. 6. However, the displacements vectors of several masks typically do not average to zero.

One embodiment of the inventive method is based on a reduction of the mask registration error contributions to the overlay error by correcting their placement errors relative to an average displacement vector field. The inventive method is based on the assumption that photolithographic masks which contribute pattern placement errors according to the mean displacement vectors $D^{Mean}(x_i, y_i)$ significantly reduce the overlay error compare to the not corrected mask set.

A difference displacement vector field $\Delta D_m(x_i, y_i)$ is determined for each mask m according to the equation:

$$\Delta D_m(x_i, y_i) = D_m(x_i, y_i) - D^{Mean}(x_i, y_i) \quad (4)$$

Figure 8:
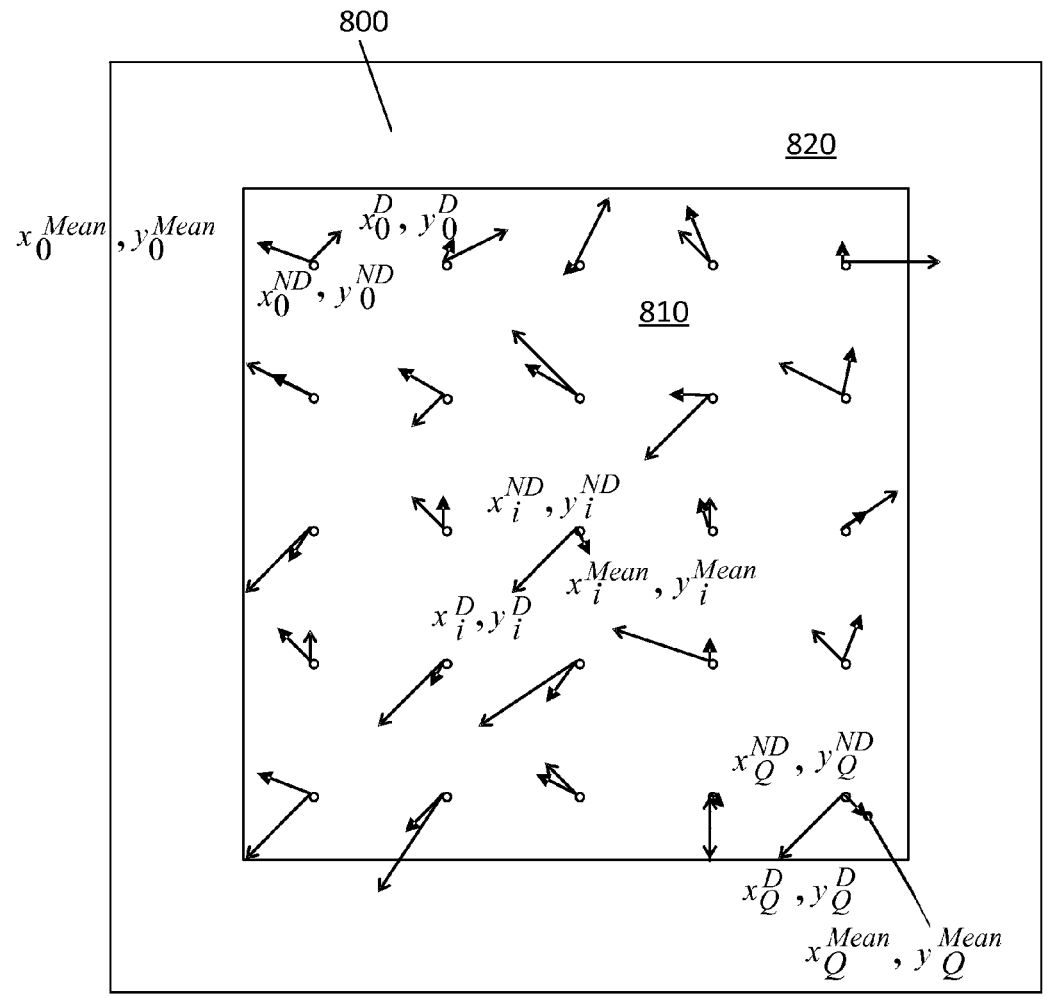
FIG. 8 schematically represents the measured placement errors of the first mask (FIG. 4) and the mean of the displacement vectors of the four masks (FIG. 7)

FIG. 8 shows the mean displacement vectors $D^{Mean}(x_i, y_i)$ at each grid node i and in addition the displacement vectors $D_1(x_i, y_i)$ of the first mask at each grid node i.

Figure 9:
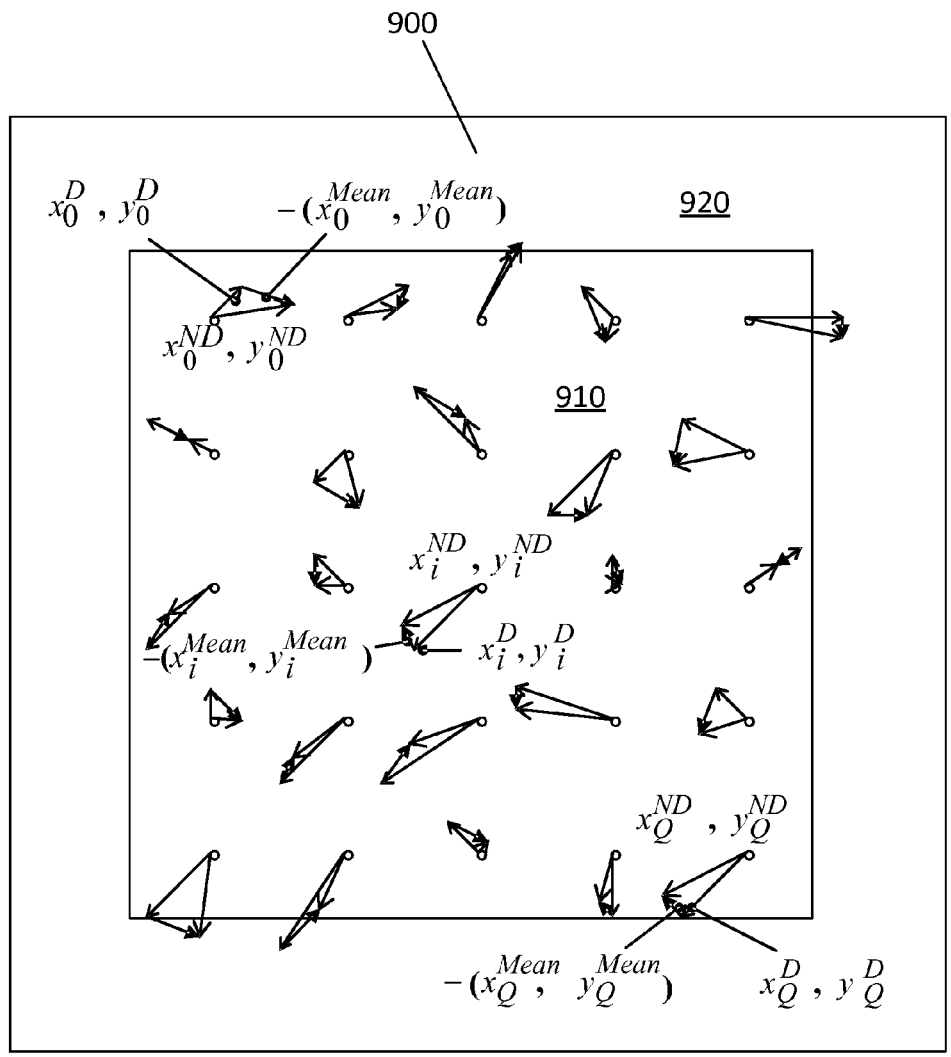
FIG. 9 schematically illustrates the construction of the difference displacement vector field for the first mask (FIG. 8)

FIG. 9 graphically illustrates, besides the displacement vectors of the first masks and the average displacement vectors, their differences according to equation 4.

Figure 10:
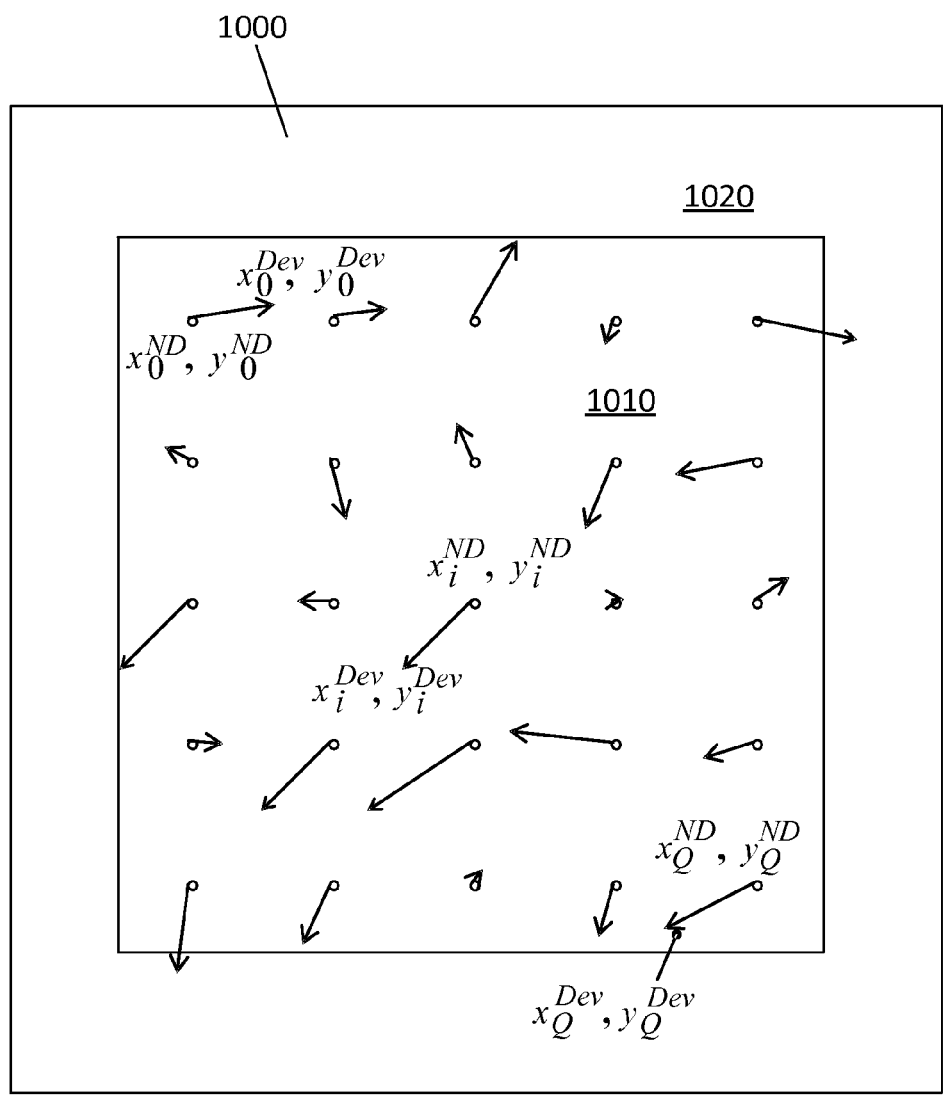
FIG. 10 schematically shows the difference displacement to vector field for the first mask.

FIG. 10 schematically shows the difference displacement placement vector field $\Delta D_m(x_i, y_i)$ of the first photolithographic mask of the mask set. The laser source 230 of the apparatus 200 of FIG. 2 then writes an arrangement of pixels in the substrate of the first mask of the mask set to minimize the difference displacement vectors (Reg C process). The pixels introduce lateral distortions in the substrate of the first mask such that the difference displacement vectors $\Delta D_m(x_i, y_i)$ of FIG. 10 vanish completely or almost completely.

The success of the placement error correction process can be controlled by measuring the positions of the grid nodes after the RegC process with the registration metrology tool 100 of FIG. 1. The RegC process is successful, if the measured pattern placement errors correspond to the mean displacement vectors $D^{Mean}(x_i, y_i)$ of FIG. 7. If the deviations of measured pattern to placement errors with respect to the mean pattern placement errors deviate from predetermined correction target values, an additional RegC process can be applied. The pattern placement correction process described above is then repeated for all other (M−1) photolithographic masks of the mask set.

In the example discussed above, it is assumed that pattern placement errors in the x and the y directions have a similar importance on the resulting overlay error. However, in reality this assumption may not be correct. In many use cases, placement errors in a first direction have a much higher importance for the functionality and performance of the integrated circuit than have errors in a second direction.

Figure 11:
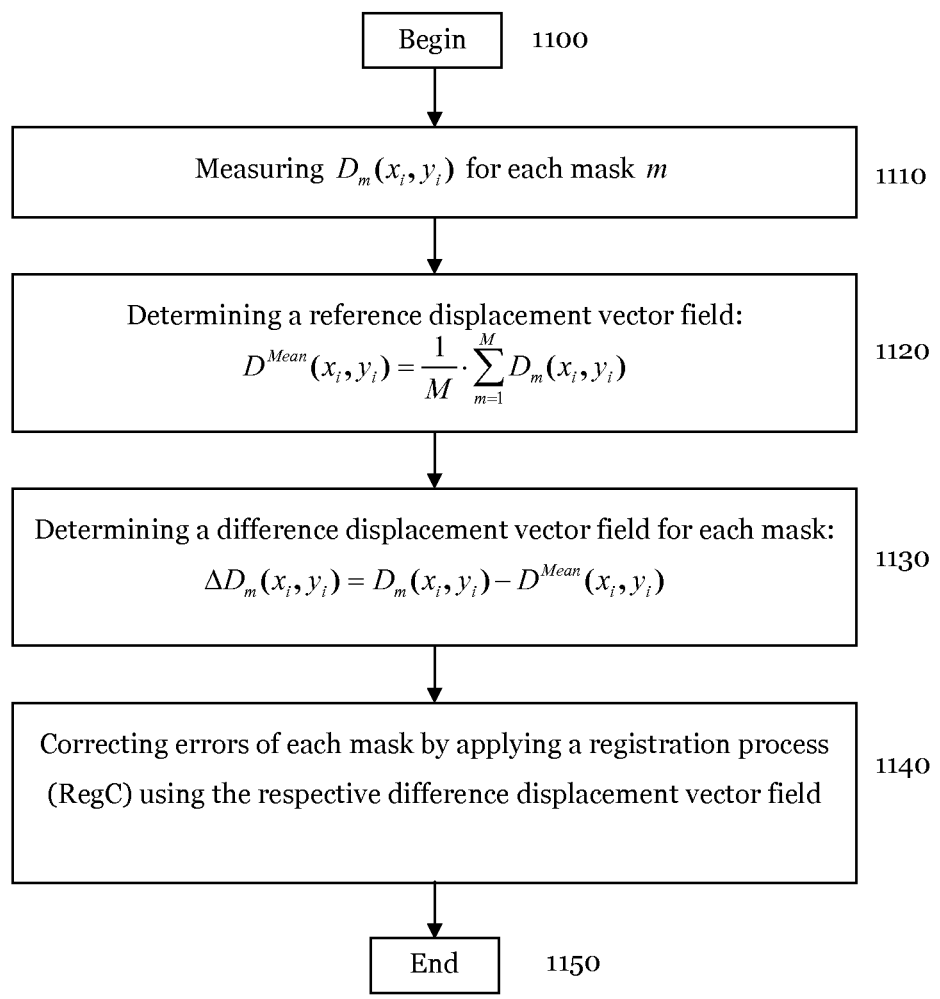
FIG. 11 presents a flow chart for a first exemplary embodiment of the inventive method.

FIG. 11 shows a flow diagram summarizing the above discussed embodiment of the inventive method. The flow starts at box 1100. First step 1110 is measuring of the registration. In a second step 1120, a reference displacement vector field is calculated according to a generalized version of equation 3. In the subsequent step 1130 a difference displacement vector field is calculated for each mask of the mask set according to equation 4. Finally, in step 1140, the difference displacement vector fields are used in a RegC process to correct placement errors of each mask of the mask set. The flow of the first embodiment ends at step 1150.

The second exemplary embodiment, discussed in the following, differs from the first example discussed above in to that the reference displacement vector field is determined in a different manner. In the second example, one mask of the mask set is used as a reference and the other ones are corrected so that they show the same pattern placement errors as the reference mask at the end of the registration error correction process.

Figure 12A:
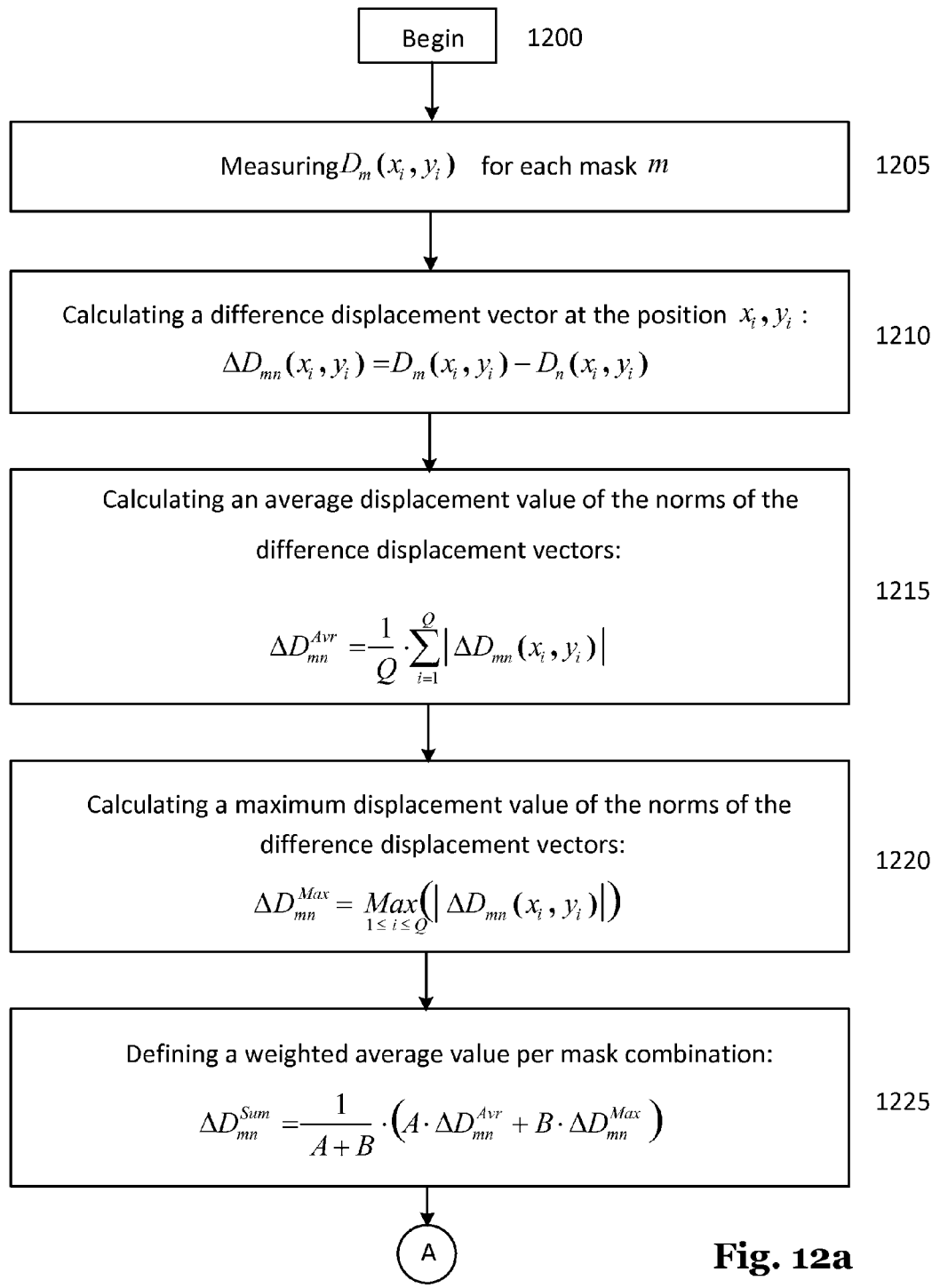
FIGS. 12a and 12b represent a flow chart for a second exemplary embodiment of the inventive method.
Figure 12B:
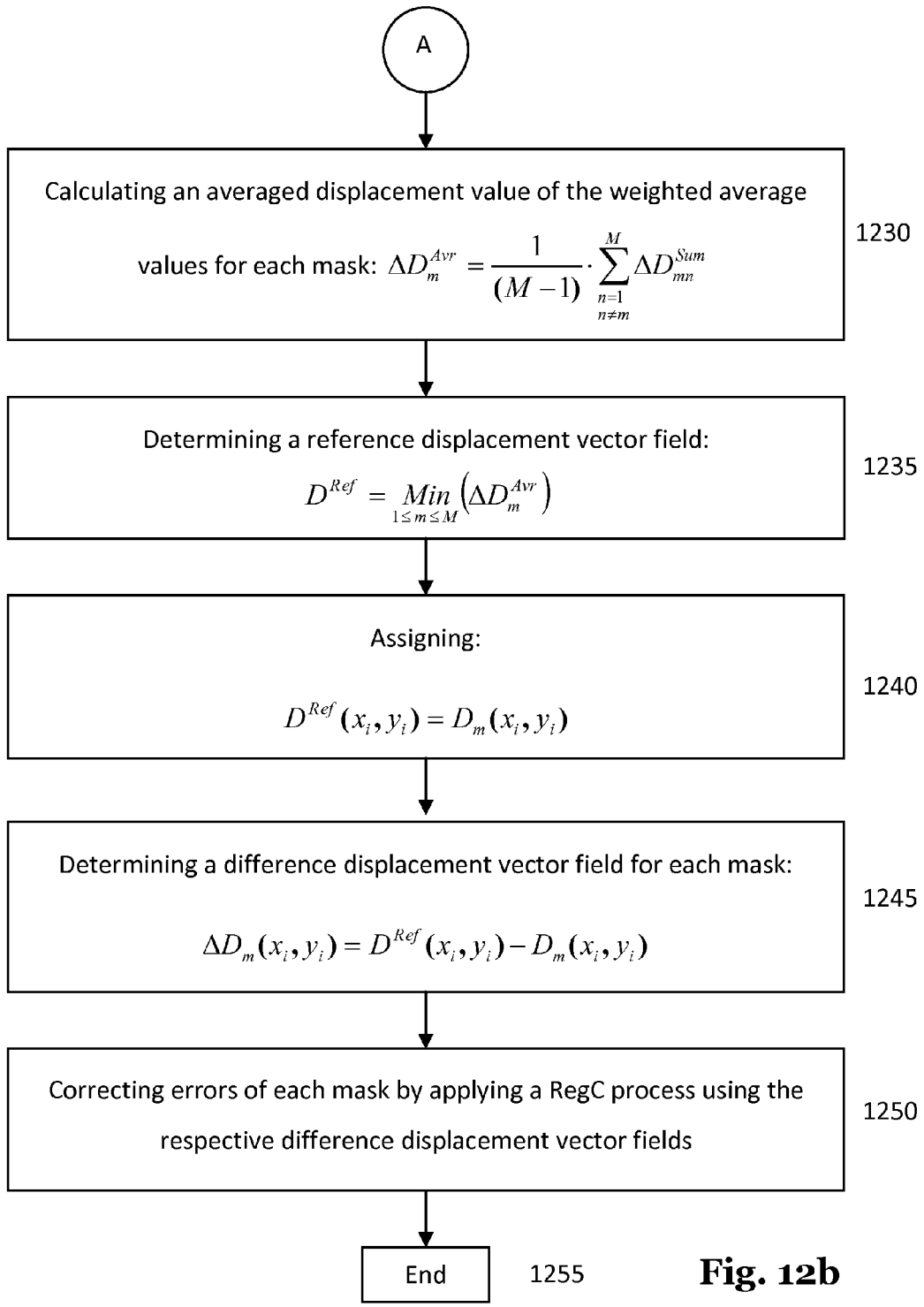

FIGS. 12a and 12b represent a flow diagram of the second embodiment. The flow begins at 1200, and as a first step 1205 the placement errors are measured for each mask. In a second step 1210, the difference displacement vectors for the mask combination m and n are defined at the position i by the equation:

$$\Delta D_{mn}(x_i,y_i)=D_{mn}(x_i,y_i)-D_n(x_i,y_i) \quad (5)$$

where $D_m(x_i,y_i)$ is defined in equation 2. Then, at step 1215, an average displacement value $\Delta D_{mn}^{Avr}$ of the absolute values of the difference displacement vectors $\Delta D_{mn}(x_i,y_i)$ for the mask combination m and n is determined by averaging $\Delta D_{mn}(x_i,y_i)$ across the number of grid nodes i according to the equation:

$$\Delta D_{mn}^{Avr} = \frac{1}{Q} \cdot \sum_{i=1}^{Q} |\Delta D_{mn}(x_i, y_i)| \quad (6)$$

In step 1220, parallel to the calculation of the average displacement value $\Delta D_{mn}^{Avr}$ according to equation 6, the maximum displacement value $\Delta D_{mn}^{Max}$ of the absolute values of the difference displacement vectors of the mask combination m and n is calculated according to the relation:

$$\Delta D_{mn}^{Max} = \underset{1 \leq i \leq Q}{\text{Max}}(|\Delta D_{mn}(x_i, y_i)|) \quad (7)$$

which describes the difference displacement vector of the to mask combination m and n having the largest magnitude.

In step 1225, a weighted average $\Delta D_{mn}^{Sum}$ of the two parameters of equations 6 and 7 is defined according to the following equation:

$$\Delta D_{mn}^{Sum} = \frac{1}{(A+B)} \cdot (A \cdot \Delta D_{mn}^{Avr} + B \cdot \Delta D_{mn}^{Max}) \quad (8)$$

where A and B are weighting parameters. The choice of the weighting parameters provides the user the possibility to exert influence on the placement error correction process. The numerical values of the parameters A and B are application dependent and are defined by the user. When A and B have identical numerical values, identical weights are put on a reduction of the average displacement value $\Delta D_{mn}^{Avr}$ and the maximum displacement value $\Delta D_{mn}^{Max}$. On the other hand, when B is selected greater than A, the reduction of the maximum displacement value is favoured compared to the average displacement value.

In step 1230, the average displacement value $\Delta D_{mn}^{Avr}$ for the mask combination m and n is averaged for mask m with respect to all other masks n of the mask set in order to determine the displacement value $\Delta D_m^{Avr}$ using the equation:

$$\Delta D_m^{Avr} = \frac{1}{(M-1)} \cdot \sum_{\substack{n=1 \\ n \neq m}}^{M} \Delta D_{mn}^{Sum} \quad (9)$$

Then, in step 1235, the photolithographic mask with the lowest displacement value $\Delta D_m^{Avr}$ of all masks is identified according to to the equation:

$$D^{Ref} = \underset{1 \leq m \leq M}{\text{Min}}(\Delta D_m^{Avr}) \quad (10)$$

This mask is the reference mask and it defines the reference displacement vector field according to (step 1240):

$$D^{Ref}(x_i,y_i)=D_m(x_i,y_i) \quad (11)$$

This mask is taken as the reference for the pattern placement error correction process; however its placement errors will not be corrected. Instead, similar to the first example, in step 1245 a difference displacement vector field $\Delta D_n(x_i,y_i)$ is defined with respect to the reference mask according to:

$$\Delta D_n(x_i,y_i)=D^{Ref}(x_i,y_i)-D_n(x_i,y_i) \quad (12)$$

The pattern placement errors of all considered photolithographic masks n are corrected with respect to the reference mask $D^{Ref}(x_i,y_i)$ by minimizing the displacement vectors of the difference displacement vector fields $\Delta D_n(x_i,y_i)$ using a RegC process. The RegC process is performed with the apparatus of FIG. 2 as has already been described in a first embodiment.

The third exemplary embodiment of the inventive method is similar to the second example, but uses in addition simulation in order to improve the result of a subsequent RegC process. This embodiment takes into account that a perfect RegC correction of individual masks is typically not possible.

Figure 13A:
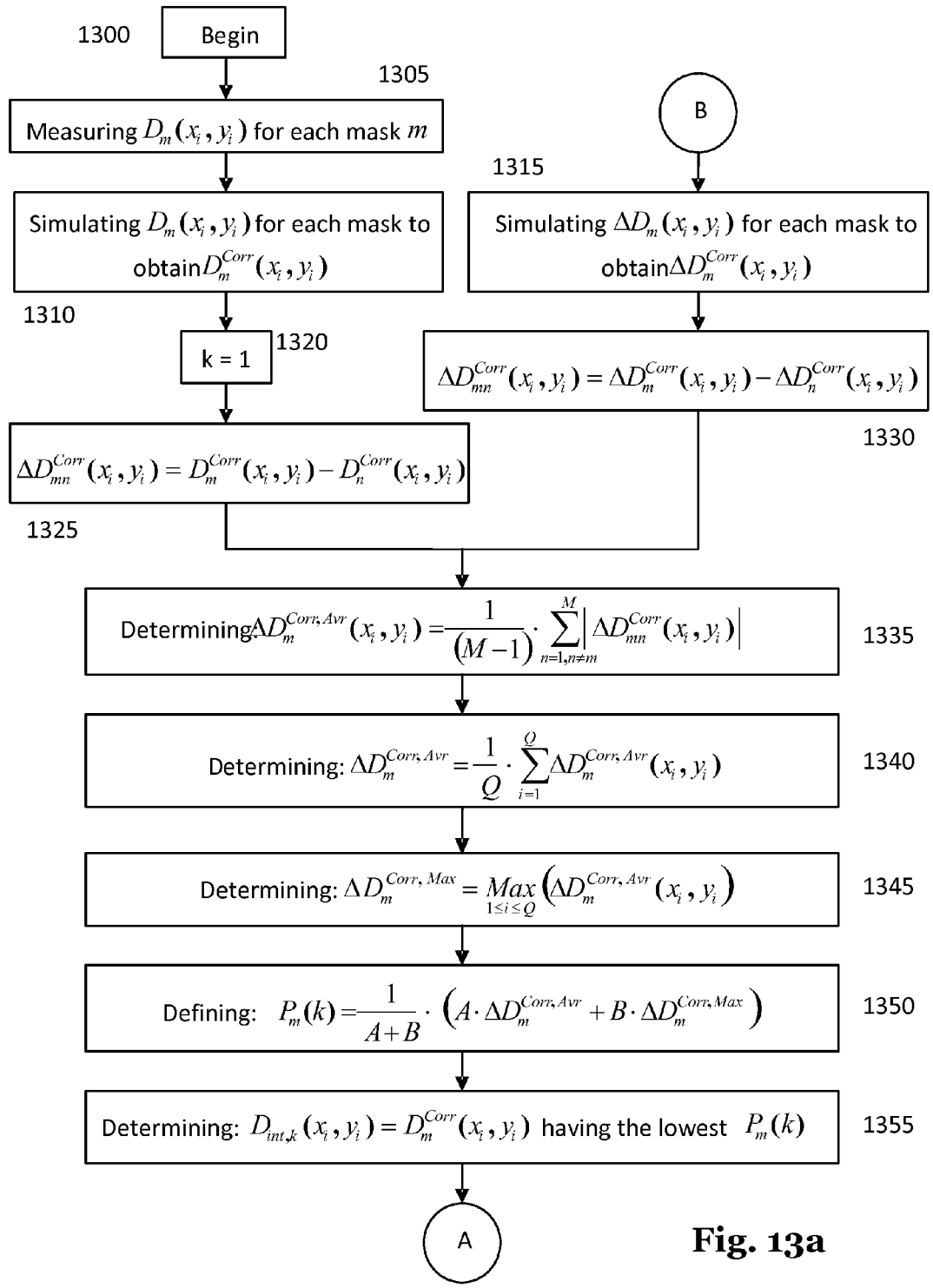
FIGS. 13a and 13b show a flow chart for a third exemplary embodiment of the inventive method.
Figure 13B:
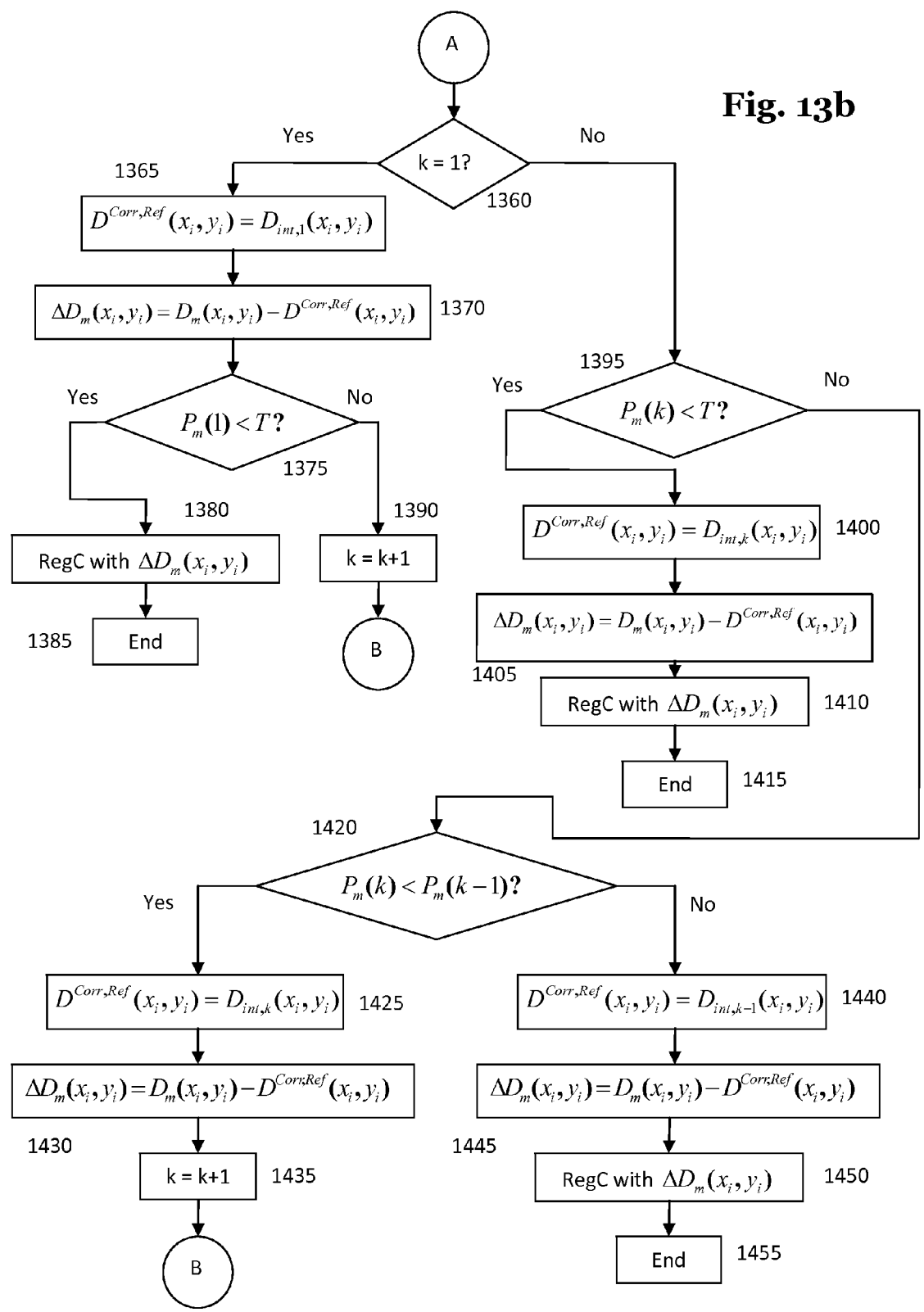

FIGS. 13a and 13b illustrate the flow diagram of the third embodiment. After begin at 1300, placement vectors $D_m(x_i,y_i)$ of registration errors of each mask m of a set are measured at step 1305. At step 1310, a RegC correction process is simulated for the placement errors $D_m(x_i,y_i)$. The displacement errors remaining after performing the simulation of the RegC correction process are referred to as the corrected displacement vector field $D_m^{Corr}(x_i,y_i)$. At step 1320, an iteration index k is set to its initial value (k=1).

In step 1325, a difference correction displacement vector field $\Delta D_{mn}^{Corr}(x_i,y_i)$ is determined for the combination of the masks m and n defined by:

$$\Delta D_{mn}^{Corr}(x_i,y_i)=D_m^{Corr}(x_i,y_i)-D_n^{Corr}(x_i,y_i) \quad (13)$$

At step 1335, for each mask m average difference correction displacement vectors are determined by averaging the norms of the difference correction displacement vector $\Delta D_{mn}^{Corr}(x_i,y_i)$ at the position i with all masks n of the mask set according to:

$$\Delta D_m^{Corr,Avr}(x_i, y_i) = \frac{1}{(M-1)} \cdot \sum_{n=1, n\neq m}^{M} |\Delta D_{mn}^{Corr}(x_i, y_i)|. \qquad (14)$$

Then, at step 1340, similar to the second example, the average correction displacement value is determining by averaging the average difference correction displacement vectors $\Delta D_m^{Corr,Avr}(x_i,y_i)$ across the area of the mask as described by:

$$\Delta D_m^{Corr,Avr} = \frac{1}{Q} \cdot \sum_{i=1}^{Q} \Delta D_m^{Corr,Avr}(x_i, y_i). \qquad (15)$$

Again analogue to the second embodiment, in step 1345 the maximum correction displacement value of the difference correction displacement vectors of the mask m is determined according to the relation:

$$\Delta D_m^{Corr,Max} = \max_{1\leq i\leq Q}(\Delta D_m^{Corr,Avr}(x_i, y_i)) \qquad (16)$$

In step 1350, an optimization parameter $P_m(k)$ is defined as a weighted sum of the average correction displacement value and the maximum correction displacement value as defined in equations 15 and 16:

$$P_m(k) = \frac{1}{A+B} \cdot (A \cdot \Delta D_m^{Corr,Avr} + B \cdot \Delta D_m^{Corr,Max}) \qquad (17)$$

Analogue to equation 8, the parameters A and B are weighting parameter balancing the influence of the average correction displacement value $\Delta D_m^{Corr,Avr}$ and the maximum correction displacement value $\Delta D_m^{Corr,Max}$.

In step 1355, an intermediate correction displacement vector field is assigned as the correction displacement vector field of the mask having the lowest numerical value of $P_m(k)$:

$$D_{int,k}(x_i,y_i) = D_m^{Corr}(x_i,y_i) \qquad (18)$$

At the decision box 1360, it is decided whether the iteration index still has its initial value or not. If k=1, the intermediate correction displacement is defined as the reference correction displacement vector field in step 1365:

$$D^{Corr,Ref}(x_i,y_i) = D_{int,1}(x_i,y_i) \qquad (19)$$

Further, in step 1370, a difference displacement vector field is defined as the difference between the measured displacement vector field $D_m(x_i,y_i)$ (see step 1305) and the reference correction displacement vector field of equation 19:

$$\Delta D_m(x_i,y_i) = D_m(x_i,y_i) - D^{Corr,Ref}(x_i,y_i) \qquad (20)$$

Then the flow proceeds to decision box 1375 where it is decided whether the numerical value of the optimization parameter is below a predetermined threshold or not. If this is the case, the overlay error correction process proceeds to step 1380 where the difference displacement vector fields of the respective mask is minimized using a RegC process and the method ends at step 1385 as the target of the process is already obtained.

If the condition of decision box 1375 is not fulfilled, in step 1390, the iteration index is increased by one unit. Then, at step 1315, the difference displacement vector field $\Delta D_m(x_i,y_i)$ of each mask m is simulated with RegC tool 100 or 200 of FIG. 1 or FIG. 2, respectively, to determine a difference correcting displacement vector field $\Delta D_m^{Corr}(x_i,y_i)$ for each mask. At step 1330, a difference correction displacement vector field $\Delta D_{mn}^{Corr}(x_i,y_i)$ is defined from the difference correction displacement vectors $\Delta D_m^{Corr}(x_1,y_1)$ according to:

$$\Delta D_{mn}^{Corr}(x_i,y_i) = \Delta D_m^{Corr}(x_i,y_i) - \Delta D_n^{Corr}(x_i,y_i) \qquad (21)$$

Then the method proceeds to step 1335.

If it is determined at the decision box 1360 that the iteration index does not have its initial value, the method proceeds to decision block 1395 where it is decided if the numerical value of the optimization parameter is below the predetermined threshold. If this is true, the intermediate correction displacement vector field $D_{int,k}(x_i,y_i)$ is defined as the reference correction displacement vector field $D^{Corr,Ref}(x_i,y_i)$ at step 1400:

$$D^{Corr,Ref}(x_i,y_i) = D_{int,k}(x_i,y_i) \qquad (22)$$

In step 1405, similar to step 1370 a difference displacement vector field $\Delta D_m(x_i,y_i)$ is defined according to equation 20 as the difference between the measured placement error field and the reference correction displacement vector field. In step 1410, the difference displacement vector field of the respective mask is minimized using a RegC process and the method ends at step 1415.

If it is at 1395 decided that the numerical value optimization parameter is larger than the threshold the method proceeds to decision box 1420. At decision box 1420 it is decided whether the numerical value of the optimization parameter of the present iteration step is smaller than in the previous iteration step. If this is not the case, at 1440, the intermediate correction displacement vector field of the previous iteration cycle is defined as the reference correction displacement vector field according to:

$$D^{Corr,Ref}(x_i,y_i) = D_{int,k-1}(x_i,y_i) \qquad (23)$$

Then, at step 1445, the difference displacement vector field is defined as given in equation 20. At step 1450, a RegC process is performed with the difference displacement vector fields $\Delta D_m(x_i,y_i)$ in order to minimize the difference displacement vector fields of the mask set and the process ends at 1455.

If it is found at 1420 that $P_m(k)$ is smaller than $P_m(k-1)$, at step 1425, the intermediate correction displacement vector field is defined as the reference correction displacement vector field as given in equation 22. At step 1430, the difference displacement vector field is calculated according to equation 20. The iteration index is increased by one unit at 1435. Then the method proceeds to step 1315 where the difference displacement vector field $\Delta D_m(x_i,y_i)$ of each mask m is simulated with the RegC tool 100 or 200 to determine a difference correction displacement vector field $\Delta D_m^{Corr}(x_i,y_i)$ for each mask. At step 1330, a difference correction displacement vector field $\Delta D_{mn}^{Corr}(x_i,y_i)$ is defined from the difference correcting displacement vector fields $\Delta D_m^{Corr}(x_i,y_i)$ according to equation 21 and then the method proceeds to step 1335.

In the described embodiments of the inventive method, the difference displacement vector fields are minimized by the application of a RegC process. In some implementations, the reference displacement vector field can be minimized using a RegC process. For this use case, it is beneficial to modify the to procedure for the determination of the reference displacement vector field.

In some implementations, two RegC processes are applied to minimize both the difference displacement vector field and the reference displacement vector field.

The invention claimed is:

1. A method for minimizing errors of a plurality of photolithographic masks, the plurality of photolithographic masks serving for successively processing a substrate, the method comprising:
   determining a reference displacement vector field, the reference displacement vector field correlating displacement vectors of the errors of the plurality of photolithographic masks;
   determining for each of the photolithographic masks a difference displacement vector field as a difference between the reference displacement vector field and the displacement vectors of the errors of the respective photolithographic mask; and
   correcting the errors for each of the photolithographic masks by applying a registration correction process using the respective difference displacement vector field or the reference displacement vector field, wherein the registration correction process modifies each of the photolithographic masks to correct the errors.

2. The method according to claim 1, wherein overlay errors are minimized by correlating displacement vectors of pattern placement errors and correcting pattern placement errors.

3. The method according to claim 2, wherein correcting the pattern placement errors comprises using a femtosecond laser source in order to locally vary a mass density of a substrate of the photolithographic mask by focusing a pulsed laser beam onto the substrate of the photolithographic mask to write an arrangement of pixels in the substrate of the photolithographic mask.

4. The method according to claim 1, wherein correlating the displacement vectors comprises averaging the displacement vectors of the errors of the plurality of photolithographic masks.

5. The method according to claim 1, wherein correlating the displacement vectors comprises:
   a. determining difference displacement vectors depending on a position at the photolithographic mask as a difference of the displacement vectors of two different masks;
   b. determining an average displacement value by averaging norms of difference displacement vectors across an area of the photolithographic mask;
   c. determining a maximum displacement value as the maximum of the norms of the difference displacement vectors across the surface of the photolithographic masks;
   d. defining a weighted average comprising the average displacement value, the maximum displacement value and weighting parameters;
   e. determining a weighted averaged displacement value for each photolithographic mask by averaging the weighted average with respect to the plurality of photolithographic masks; and
   f. determining a reference displacement vector field as the displacement vector field of the photolithographic masks having a lowest weighted averaged displacement value of the plurality of photolithographic masks.

6. The method according to claim 1, wherein the errors are overlay errors, and wherein the method further comprises using a subset of the plurality of photolithographic masks for minimizing overlay errors.

7. The method according to claim 1, wherein for each position $x_i, y_i$ a reference displacement vector $D^{Mean}(x_i, y_i)$ is calculated according to:

$$D^{Mean}(x_i, y_i) = \frac{1}{M} \cdot \sum_{m=1}^{M} D_m(x_i, y_i),$$

where $D_m(x_i, y_i)$ is the displacement vector of the pattern placement error of the photolithographic mask m at the position $x_i, y_i$;
   or wherein the difference displacement vector field for photolithographic mask m at the position $x_i, y_i$ is determined by: $\Delta D_m(x_i, y_i) = D_m(x_i, y_i) - D^{Mean}(x_i, y_i)$, where $D^{Mean}(x_i, y_i)$ is the reference displacement vector field.

8. The method according to claim 1, wherein the reference displacement vector field $D^{Ref}(x_i, y_i)$ is determined by:
   a. calculating a difference displacement vector $\Delta D_m(x_i, y_i)$ at a position $x_i, y_i$ as a difference of displacement vectors $D_m(x_i, y_i)$ of a photolithographic mask m and $D_n(x_i, y_i)$ of a photolithographic mask n according to: $\Delta D_m(x_i, y_i) = D_m(x_i, y_i) - D_n(x_i, y_i)$;
   b. calculating an average displacement value of the norms of the difference displacement vectors $\Delta D_m(x_i, y_i)$ according to:

$$\Delta D_{mn}^{Avr} = \frac{1}{Q} \cdot \sum_{i=1}^{Q} |\Delta D_{mn}(x_i, y_i)|;$$

c. calculating a maximum displacement value $\Delta D_{mn}^{Max}$ of the norms of the differences of the displacement vectors $\Delta D_m(x_i, y_i)$ according to:

$$\Delta D_{mn}^{Max} = \underset{1 \le i \le Q}{\text{Max}}(|\Delta D_{mn}(x_i, y_i)|);$$

d. defining a weighted average $\Delta D_{mn}^{Sum}$ of the average displacement value $\Delta D_{mn}^{Avr}$ and the maximum displacement value $\Delta D_{mn}^{Max}$ according to:

$$\Delta D_{mn}^{Sum} = \frac{1}{A+B} \cdot (A \cdot \Delta D_{mn}^{Avr} + B \cdot \Delta D_{mn}^{Max}),$$

where A and B are weighting parameters;
   e. calculating a weighted averaged displacement value $\Delta D_m^{Avr}$ for each photolithographic mask m from the weighted average $\Delta D_{mn}^{Sum}$ with respect to all other photolithographic masks n according to:

$$\Delta D_m^{Avr} = \frac{1}{(M-1)} \cdot \sum_{\substack{n=1 \\ n \ne m}}^{M} \Delta D_{mn}^{Sum};$$

and
   f. determining a reference displacement vector field $D^{Ref}(x_i, y_i)$ as a displacement vector field $D_m(x_i, y_i)$ of the photolithographic mask m having the lowest weighted averaged displacement value of all photolithographic masks according to:

$$D^{Ref} = \underset{1 \leq m \leq M}{\text{Min}} (\Delta D_m^{Avr})$$

and assigning: $D^{Ref}(x_i,y_i)=D_m(x_i,y_i)$;
or wherein the difference displacement vector field of the photolithographic mask m is determined by: $\Delta D_m(x_i, y_i)=D^{Ref}(x_i,y_i)-D_m(x_i,y_i)$, where $D^{Ref}(x_i,y_i)$ is the reference displacement vector field;
or wherein A=0 or B=0.

9. The method according to claim 1, further comprising:
 a. simulating a corrected displacement vector field for each photolithographic mask comprising displacement errors after application of a correction process, and setting an iteration index to a starting value;
 b. determining difference correction displacement vectors as a difference of corrected displacement vectors of two different photolithographic masks for each combination of photolithographic masks;
 c. determining for each photolithographic mask average difference correction displacement vectors by averaging norms of the difference correction displacement vectors with respect to other photolithographic masks;
 d. determining for each photolithographic mask an average correction displacement value by averaging the average difference correction displacement vectors;
 e. determining for each photolithographic mask a maximum correction displacement value as a largest numerical value of the average difference correction displacement vectors;
 f. defining for each photolithographic mask an optimization parameter as a weighted sum of an average correction displacement value and the maximum correction displacement value, wherein weighting parameters are applied to the average correction displacement value and the maximum correction displacement value, wherein the optimization parameter depends on the iteration index;
 g. determining an intermediate correction displacement vector field as a correction displacement vector field of the photolithographic mask having a lowest numerical value of the optimization parameter;
 h. if an iteration index has the starting value taking the intermediate correction displacement vector field as the reference correction displacement vector field, calculating for each photolithographic mask a difference displacement vector field as the difference between a displacement vector field and the reference correction displacement vector field, comparing the optimization parameter with a predetermined threshold, if the optimization parameter is below a threshold: correcting the errors for each photolithographic mask using the respective difference displacement vector field, and ending the simulation process, and if the optimization parameter is above the threshold: increasing the iteration index by one unit;
 i. if the iteration index does not have the starting value: comparing the optimization parameter with the threshold, if the optimization parameter is below the threshold, taking the intermediate correction displacement vector field as the reference correction displacement vector field, calculating for each photolithographic mask a difference displacement vector field as the difference between the displacement vector field and the reference correction displacement vector field, correcting the errors for each photolithographic mask using the respective difference displacement vector field, and ending the simulation process;
 if the iteration index does not have the starting value and if the optimization parameter is larger than the threshold: comparing the optimization parameter of the previous iteration step with the optimization parameter of the present iteration step, if the optimization parameter of the present iteration step is larger than the optimization parameter of the previous iteration step, taking the intermediate correction displacement vector field of the previous iteration as the reference correction displacement vector field, calculating for each photolithographic mask a difference displacement vector field as the difference between the displacement vector field and the reference correction displacement vector field, correcting the errors for each photolithographic mask using the respective difference displacement vector field, and ending the simulation process;
 k. if the iteration index does not have the starting value and if the optimization parameter of the present iteration step is below the optimization parameter of the previous iteration step: taking the intermediate correction displacement vector field as the reference correction displacement vector field, calculating for each photolithographic mask a difference displacement vector field as the difference between the displacement vector field and the reference correction displacement vector field, and increasing the iteration index by one unit;
 l. simulating the difference displacement vector field for each photolithographic mask to determine a difference correction displacement vector field;
 m. determining difference correction displacement vectors as a difference of difference correcting displacement vectors of two different photolithographic masks for each combination of the photolithographic masks; and
 n. repeating c. to k.

10. The method according to claim 9, wherein for k=1 the difference correction displacement vector $\Delta D_{mn}^{Corr}(x_i,y_i)$ at the position $x_i,y_i$ is a difference of the correcting displacement vectors $D_m^{Corr}(x_i,y_i)$ of the photolithographic mask m and $D_n^{Corr}(x_i,y_i)$ of the photolithographic mask n according to: $\Delta D_{mn}^{Corr}(x_i,y_i)=D_m^{Corr}(x_i,y_i)-D_n^{Corr}(x_i,y_i)$, and for k≠1 the difference correction displacement vector $\Delta D_{mn}^{Corr}(x_i,y_i)$ is the difference of the difference correcting displacement vectors $\Delta D_m^{Corr}(x_i,y_i)$ of the photolithographic mask m and $\Delta D_n^{Corr}(x_i,y_i)$ of the photolithographic mask n according to: $\Delta D_{mn}^{Corr}(x_i,y_i)=\Delta D_m^{Corr}(x_i,y_i)-\Delta D_n^{Corr}(x_i,y_i)$;
 or wherein an average correction displacement vector $\Delta D_m^{Corr,Avr}(x_i,y_i)$ of the photolithographic mask m with respect to all photolithographic masks n is determined from the norms of the difference correction displacement vectors $\Delta D_{mn}^{Corr}(x_i,y_i)$ according to:

$$\Delta D_m^{Corr,Avr}(x_i, y_i) = \frac{1}{(M-1)} \cdot \sum_{n=1,n \neq m}^{M} |\Delta D_{mn}^{Corr}(x_i, y_i)|.$$

11. The method according to claim 9, wherein determining an average correction displacement value $\Delta D_m^{Corr,Avr}$ for the photolithographic mask m comprises averaging of average correction displacement vectors $\Delta D_m^{Corr,Avr}(x_i,y_i)$ across an area of the photolithographic mask m according to:

$$\Delta D_m^{Corr,Avr} = \frac{1}{Q} \cdot \sum_{i=1}^{Q} \Delta D_m^{Corr,Avr}(x_i, y_i);$$

and wherein determining a maximum correction displacement value $\Delta D_m^{Corr,Max}$ comprises determining a maximum of all average correction displacement vectors $\Delta D_m^{Corr,Avr}(x_i, y_i)$ of the photolithographic mask m according to:

$$\Delta D_m^{Corr,Max} = \underset{1 \leq i \leq Q}{\text{Max}}(\Delta D_m^{Corr,Avr}(x_i y_i));$$

or wherein an optimization parameter $P_m(k)$ for the photolithographic mask m comprises the average correction displacement value $\Delta D_m^{Corr,Avr}$ and the maximum correction displacement value $\Delta D_m^{Corr,Max}$ according to:

$$P_m(k) = \frac{1}{A+B} \cdot (A \cdot \Delta D_m^{Corr,Avr} + B \cdot \Delta D_m^{Corr,Max}),$$

where A and B are weighting parameters and k is the iteration index beginning with k=1.

12. The method according to claim 9, wherein the intermediate correction displacement vector field $D_{int}(x_i,y_i)$ is the correction displacement vector field of the photolithographic mask $D_m^{Corr}(x_i,y_i)$ having the lowest numerical value of the optimization parameter $P_m(k)$ for all photolithographic masks m according to: $D_{int,k}(x_i,y_i)=D_m^{Corr}(x_i,y_i)$;
or wherein if the optimization parameter $P_m(k)$ is below a predetermined threshold T the reference correction displacement vector field is defined by the intermediate correction displacement vector field according to: $D^{Corr,Ref}(x_i,y_i)=D_{int,k}(x_i,y_i)$, and if the optimization parameter of a previous iteration step is smaller than the optimization parameter of the present iteration step the reference correction displacement vector field is: $D^{Corr,Ref}(x_i,y_i)=D_{int,k-1}(x_i,y_i)$.

13. The method according to claim 9, wherein the difference displacement vector field $\Delta D_m(x_i,y_i)$ is the difference of the displacement vector field $D_m(x_i,y_i)$ and the reference correction displacement vector field $D^{Corr,Ref}(x_i,y_i)$ according to: $\Delta D_m(x_i,y_i)=D_m(x_i,y_i)-D^{Corr,Ref}(x_i,y_i)$;
or further comprising simulating the difference displacement vector fields $\Delta D_m(x_i,y_i)$ for each photolithographic mask m to obtain difference correcting displacement vector fields $\Delta D_m^{Corr}(x_i,y_i)$.

14. The method according to claim 9, wherein if k=1:
I. if $P_m(1)<T$, ending the simulation process; and
II. if $P_m(1)T$, k=k+1 and performing the next iteration step;
or wherein when k≠1 and if:
III. if $P_m(k)<T$: correcting the errors for each photolithographic mask using the respective difference displacement vector field and ending the simulation process;
IV. if $P_m(k)<P_m(k-1)$, k=k+1 and performing the next iteration step; and V. if $P_m(k) \geq P_m(k-1)$, determining the reference displacement vector field as $D^{Corr,Ref}(x_i,y_i)=D_{int,k-1}(x_i,y_i)$, correcting the errors for each photolithographic mask using the respective difference displacement vector field and ending the simulation process.

15. An apparatus for minimizing errors of a plurality of photolithographic masks, the plurality of photolithographic masks serving for successively processing a wafer, comprising:
a. at least one computing means containing algorithms realized in hardware, software or a combination of hardware and software, the at least one computing means being configured to determining a reference displacement vector field, the reference displacement vector field correlates displacement vectors of the errors of the plurality of photolithographic masks, determining for each of the photolithographic masks a difference displacement vector field as a difference between the reference displacement vector field and the displacement field of the pattern placement errors; and
b. at least one laser system adapted for correcting the errors for each of the photolithographic masks using the respective difference displacement vector field or the reference displacement vector field by focusing a pulsed laser beam onto the substrate of the photolithographic mask to write an arrangement of pixels in the substrate of the photolithographic mask.

16. The apparatus according to claim 15, wherein the apparatus performs a method comprising:
determining a reference displacement vector field, the reference displacement vector field correlating displacement vectors of the errors of the plurality of photolithographic masks;
determining for each of the photolithographic masks a difference displacement vector field as a difference between the reference displacement vector field and the displacement vectors of the errors of the respective photolithographic mask; and
correcting the errors for each of the photolithographic masks by applying a registration correction process using the respective difference displacement vector field or the reference displacement vector field wherein the registration correction process modifies each of the photolithographic masks to correct the errors.

17. The apparatus according to claim 15, wherein the errors are overlay errors, and the overlay errors are minimized by correlating displacement vectors of pattern placement errors and correcting pattern placement errors.

18. The apparatus according to claim 15, comprising an inspection system that comprises an ultra-precision stage, at least one laser source and a charge-coupled device camera both operating in an ultraviolet wavelength range.

19. The apparatus according to claim 18, wherein the at least one computing means is configured to control the inspection system and the laser system.

20. The apparatus according to claim 15, wherein the at least one laser system comprises a femtosecond laser source.

* * * * *

UNITED STATES PATENT AND TRADEMARK OFFICE
CERTIFICATE OF CORRECTION

PATENT NO. : 8,539,394 B2
APPLICATION NO. : 13/408695
DATED : September 17, 2013
INVENTOR(S) : Rainer Pforr Page 1 of 1

It is certified that error appears in the above-identified patent and that said Letters Patent is hereby corrected as shown below:

Title Page 2
(56) References Cited, Other Publications, column 2, Y. Shimotsuma et al. reference, line 2, delete "Left." and insert -- Lett. --

In the Claims

Column 20
Claim 8, line 17, delete "calculating a difference displacement vector $\Delta D_m (x_i, y_i)$" and insert -- calculating a difference displacement vector $\Delta D_{mn} (x_i, y_i)$ --
Claim 8, line 20, delete "a photolithographic mask $n$ according to: $\Delta D_m (x_i, y_i)$" and insert -- a photolithographic mask $n$ according to: $\Delta D_{mn} (x_i, y_i)$ --
Claim 8, line 23, delete "of the difference displacement vectors $\Delta D_m (x_i, y_i)$" and insert -- of the difference displacement vectors $\Delta D_{mn} (x_i, y_i)$ --

Column 22
Claim 9, line 4, before "if" insert -- j. --

Column 23
Claim 14, line 53, delete "$P_m (1)T$" and insert -- $P_m (1) \geq T$ --
Claim 14, line 54, after "k≠l" delete "and if"

Column 24
Claim 16, line 42, after "field" insert -- , --

Signed and Sealed this
Thirty-first Day of December, 2013

Margaret A. Focarino
*Commissioner for Patents of the United States Patent and Trademark Office*